US011949398B2

(12) United States Patent
Weng et al.

(10) Patent No.: US 11,949,398 B2
(45) Date of Patent: Apr. 2, 2024

(54) SEMICONDUCTOR DEVICE

(71) Applicant: Shenzhen Newsonic Technologies Co., Ltd., Shenzhen (CN)

(72) Inventors: Guojun Weng, Shenzhen (CN); Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/992,439

(22) Filed: Nov. 22, 2022

(65) Prior Publication Data

US 2023/0081474 A1 Mar. 16, 2023

(30) Foreign Application Priority Data

Jul. 8, 2022 (CN) .......................... 202210796843.1

(51) Int. Cl.
*H03H 9/02* (2006.01)
*H03H 3/02* (2006.01)
*H03H 9/05* (2006.01)
*H03H 9/13* (2006.01)

(52) U.S. Cl.
CPC .......... *H03H 9/02086* (2013.01); *H03H 3/02* (2013.01); *H03H 9/0504* (2013.01); *H03H 9/133* (2013.01)

(58) Field of Classification Search
CPC .... H03H 9/02086; H03H 3/02; H03H 9/0504; H03H 9/133; H03H 9/02125; H03H 2003/021; H03H 9/02133; H03H 9/173; H03H 9/02543; H03H 9/02614; H03H 9/54; H10N 30/80; H10N 30/03
USPC .................................................. 333/187, 188
See application file for complete search history.

(56) References Cited

U.S. PATENT DOCUMENTS

2018/0287584 A1* 10/2018 Azarnaminy .......... H03H 9/173

* cited by examiner

*Primary Examiner* — Rakesh B Patel
*Assistant Examiner* — Jorge L Salazar, Jr.
(74) *Attorney, Agent, or Firm* — Leason Ellis LLP

(57) ABSTRACT

A semiconductor device is provided. The semiconductor device incudes: a first sub-semiconductor structure including a dielectric layer; and a second sub-semiconductor structure, at least including a carrier substrate, and being bonded to the first sub-semiconductor structure. The first sub-semiconductor structure or the second sub-semiconductor structure includes a charge accumulation preventing layer, and the charge accumulation preventing layer is disposed between the carrier substrate and the dielectric layer, and is configured to avoid an undesired conductive channel from being generated due to charge accumulation on a surface of the carrier substrate.

18 Claims, 15 Drawing Sheets

SEMICONDUCTOR DEVICE

The application claims priority to the Chinese patent application No. 202210796843.1, filed Jul. 8, 2022, the entire disclosure of which is incorporated herein by reference as part of the present application.

TECHNICAL FIELD

The embodiments of the present disclosure relate to a semiconductor device.

BACKGROUND

In conventional semiconductor devices, a monocrystalline silicon substrate is usually used as a base substrate, and in the case where the monocrystalline silicon substrate is bonded to another semiconductor structure, a silicon oxide layer is usually used as a bonding layer which is bonded to the monocrystalline silicon substrate. In addition, a layer of native oxide, such as silicon oxide, usually exists on the surface of the monocrystalline silicon substrate. However, since silicon oxide is naturally rich in electrons, in the case where the monocrystalline silicon substrate and the silicon oxide layer are bonded together, the monocrystalline silicon will capture electrons from the silicon oxide layer and/or the native silicon oxide, thereby causing charge accumulation occurred at the contact interface between the monocrystalline silicon substrate and silicon oxide and generating an undesired conductive channel, which further affects the performance of the semiconductor device. For example, in the case where the semiconductor device is a resonator or a filter, such a conductive channel will directly cause radio frequency loss of the resonator and filter, thereby greatly reducing the performance of the resonator and filter.

SUMMARY

At least one embodiment of the disclosure provides a semiconductor device, comprising: a first sub-semiconductor structure, comprising a dielectric layer; and a second sub-semiconductor structure, at least comprising a carrier substrate, and being bonded to the first sub-semiconductor structure, wherein the first sub-semiconductor structure or the second sub-semiconductor structure comprises a charge accumulation preventing layer, and the charge accumulation preventing layer is disposed between the carrier substrate and the dielectric layer, and is configured to avoid an undesired conductive channel from being generated due to charge accumulation on a surface of the carrier substrate.

In the semiconductor device according to at least one embodiment of the disclosure, the carrier substrate is a semiconductor substrate, the charge accumulation preventing layer is in direct contact with the carrier substrate, and at least a surface layer of the charge accumulation preventing layer contacting the carrier substrate is a non-conductive and non-silicon-oxide layer.

In the semiconductor device according to at least one embodiment of the disclosure, at least the surface layer of the charge accumulation preventing layer directly contacting the carrier substrate comprises at least one selected from the group consisting of polysilicon, amorphous silicon, silicon nitride, silicon carbide, aluminum nitride and gallium nitride.

In the semiconductor device according to at least one embodiment of the disclosure, a contact interface between the carrier substrate and the charge accumulation preventing layer does not include silicon oxide.

In the semiconductor device according to at least one embodiment of the disclosure, the second sub-semiconductor structure further comprises a barrier layer, the barrier layer is disposed on the carrier substrate and between the carrier substrate and the dielectric layer, and the barrier layer is in direct contact with the carrier substrate and serves as the charge accumulation preventing layer.

In the semiconductor device according to at least one embodiment of the disclosure, the barrier layer is a single-layer structure, and a material of the barrier layer comprises one selected from the group consisting of polysilicon, amorphous silicon, silicon nitride, silicon carbide, aluminum nitride, and gallium nitride.

In the semiconductor device according to at least one embodiment of the disclosure, the barrier layer is a multi-layer structure, and the barrier layer comprises a stack layer comprising at least two selected from the group consisting of polysilicon, amorphous silicon, silicon nitride, silicon carbide, aluminum nitride, gallium nitride and silicon oxide, and wherein a surface layer of the barrier layer contacting the carrier substrate does not include silicon oxide.

In the semiconductor device according to at least one embodiment of the disclosure, the second sub-semiconductor structure further comprises a buffer layer, and the buffer layer is disposed on a side of the barrier layer away from the carrier substrate and between the barrier layer and the dielectric layer.

In the semiconductor device according to at least one embodiment of the disclosure, a material of the buffer layer comprises at least one selected from the group consisting of silicon nitride, silicon oxide, aluminum nitride, polysilicon, and amorphous silicon.

In the semiconductor device according to at least one embodiment of the disclosure, one of a material of the buffer layer and a material of the barrier layer has tensile stress, and the other one of the material of the buffer layer and the material of the barrier layer has compressive stress, so as to be configured to balance a warpage of the carrier substrate.

In the semiconductor device according to at least one embodiment of the disclosure, the first sub-semiconductor structure and the second sub-semiconductor structure are bonded together through bonding the dielectric layer and the buffer layer to each other.

In the semiconductor device according to at least one embodiment of the disclosure, the first sub-semiconductor structure further comprises a first bonding layer, and the first bonding layer is disposed on a side of the dielectric layer close to the second sub-semiconductor structure, the second sub-semiconductor structure further comprises a second bonding layer, and the second bonding layer is disposed on a side of the buffer layer close to the first sub-semiconductor structure, the first sub-semiconductor structure and the second sub-semiconductor structure are bonded together through bonding the first bonding layer and the second bonding layer to each other.

In the semiconductor device according to at least one embodiment of the disclosure, the first bonding layer and the second bonding layer comprise amorphous silicon.

In the semiconductor device according to at least one embodiment of the disclosure, the first sub-semiconductor structure further comprises a first bonding layer, and the first bonding layer is disposed on a side of the dielectric layer close to the second sub-semiconductor structure, the first sub-semiconductor structure and the second sub-semiconductor structure are bonded together through bonding the first bonding layer and the buffer layer to each other.

In the semiconductor device according to at least one embodiment of the disclosure, the first bonding layer comprises amorphous silicon, and the buffer layer comprises at least one selected from the group consisting of silicon nitride, silicon oxide, aluminum nitride, polysilicon, and amorphous silicon, and at least a surface layer of the buffer layer at a side away from the carrier substrate comprises polysilicon or amorphous silicon.

In the semiconductor device according to at least one embodiment of the disclosure, the first sub-semiconductor structure further comprises a first bonding layer, and the first bonding layer is disposed on a side of the dielectric layer close to the second sub-semiconductor structure, and the first sub-semiconductor structure and the second sub-semiconductor structure are bonded together through bonding the first bonding layer and the barrier layer to each other.

In the semiconductor device according to at least one embodiment of the disclosure, the first bonding layer comprises amorphous silicon, and at least a surface layer of the barrier layer at a side away from the carrier substrate comprises polysilicon or amorphous silicon.

In the semiconductor device according to at least one embodiment of the disclosure, the first sub-semiconductor structure further comprises a first bonding layer, and the first bonding layer is disposed on a side of the dielectric layer close to the second sub-semiconductor structure, the second sub-semiconductor structure further comprises a second bonding layer, and the second bonding layer is disposed on a side of the barrier layer close to the first sub-semiconductor structure, and the first sub-semiconductor structure and the second sub-semiconductor structure are bonded together through bonding the first bonding layer and the second bonding layer to each other.

In the semiconductor device according to at least one embodiment of the disclosure, at least one of the first sub-semiconductor structure and the second sub-semiconductor structure further comprises a bonding layer, and the bonding layer is disposed between the dielectric layer and the carrier substrate, and serves as the charge accumulation preventing layer.

In the semiconductor device according to at least one embodiment of the disclosure, the bonding layer comprises amorphous silicon.

In the semiconductor device according to at least one embodiment of the disclosure, the first sub-semiconductor structure comprises the bonding layer, and the bonding layer is disposed on a side of the dielectric layer close to the second sub-semiconductor structure, and the first sub-semiconductor structure and the second sub-semiconductor structure are bonded together through bonding the bonding layer and the carrier substrate to each other.

In the semiconductor device according to at least one embodiment of the disclosure, the first sub-semiconductor structure further comprises a first bonding layer, and the first bonding layer is disposed on a side of the dielectric layer close to the second sub-semiconductor structure; the second sub-semiconductor structure further comprises a second bonding layer, and the second bonding layer is disposed on a side of the carrier substrate close to the first sub-semiconductor structure and serves as the charge accumulation preventing layer, the first sub-semiconductor structure and the second sub-semiconductor structure are bonded together through bonding the first bonding layer and the second bonding layer to each other.

In the semiconductor device according to at least one embodiment of the disclosure, the first bonding layer and the second bonding layer comprise amorphous silicon.

In the semiconductor device according to at least one embodiment of the disclosure, the first sub-semiconductor structure has a cavity, and a portion of a boundary of the cavity is defined by the dielectric layer.

In the semiconductor device according to at least one embodiment of the disclosure, the first sub-semiconductor structure and the second sub-semiconductor structure enclose to form a cavity, and the cavity is defined by material layers of the first sub-semiconductor structure and the second sub-semiconductor structure that faces each other.

In the semiconductor device according to at least one embodiment of the disclosure, the semiconductor device is a bulk acoustic wave resonator, and the first sub-semiconductor structure further comprises a piezoelectric layer, and a first electrode and a second electrode disposed on opposite sides of the piezoelectric layer, the dielectric layer is disposed between the piezoelectric layer and the second sub-semiconductor structure, the bulk acoustic wave resonator has a cavity, and the cavity is disposed between the piezoelectric layer and the second sub-semiconductor structure, and is surrounded by the dielectric layer in a direction parallel to a main surface of the carrier substrate.

In the semiconductor device according to at least one embodiment of the disclosure, the cavity is defined by the dielectric layer and the piezoelectric layer; the dielectric layer has sidewalls facing each other and defining the cavity in the direction parallel to the main surface of the carrier substrate; the dielectric layer and the piezoelectric layer have surfaces facing each other and defining the cavity in a direction perpendicular to the main surface of the carrier substrate.

In the semiconductor device according to at least one embodiment of the disclosure, the second sub-semiconductor structure further comprises a barrier layer and a buffer layer, the barrier layer and the buffer layer are disposed on a side of the carrier substrate close to the first sub-semiconductor structure; the cavity is defined by the dielectric layer, the piezoelectric layer of the first sub-semiconductor structure and the buffer layer of the second sub-semiconductor structure.

In the semiconductor device according to at least one embodiment of the disclosure, the first sub-semiconductor structure further comprises a first bonding layer, and the first bonding layer is disposed along sidewalls of the dielectric layer and a surface of the dielectric layer at a side close to the second sub-semiconductor structure, and surfaces of the piezoelectric layer and the second electrode at a side close to the second sub-semiconductor structure; a first portion of the first bonding layer is bonded to the second sub-semiconductor structure, and the cavity is defined between a second portion of the first bonding layer and the second sub-semiconductor structure.

In the semiconductor device according to at least one embodiment of the disclosure, the second sub-semiconductor structure further comprises a second bonding layer, and the second bonding layer is disposed on a side of the carrier substrate close to the first sub-semiconductor structure, the first portion of the first bonding layer is bonded to a first portion of the second bonding layer, and the cavity is defined between the second portion of the first bonding layer and a second portion of the second bonding layer.

In the semiconductor device according to at least one embodiment of the disclosure, the first portion of the first bonding layer is bonded to a first portion of the carrier substrate, and the cavity is defined between the second portion of the first bonding layer and a second portion of the carrier substrate.

In the semiconductor device according to at least one embodiment of the disclosure, the second sub-semiconductor structure further comprises a barrier layer, and the barrier layer is disposed on a side of the carrier substrate close to the first sub-semiconductor structure, the first portion of the first bonding layer is bonded to a first portion of the barrier layer, and the cavity is defined between the second portion of the first bonding layer and a second portion of the barrier layer.

In the semiconductor device according to at least one embodiment of the disclosure, the second sub-semiconductor structure further comprises a barrier layer and a buffer layer, the barrier layer and the buffer layer are disposed on a side of the carrier substrate close to the first sub-semiconductor structure, the first portion of the first bonding layer is bonded to a first portion of the buffer layer, and the cavity is defined between the second portion of the first bonding layer and a second portion of the buffer layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

In the semiconductor devices provided by various embodiments of the present disclosure, a charge accumulation preventing layer is formed on the surface of the carrier substrate or a material layer bonded to the carrier substrate is configured as the charge accumulation preventing layer, further, a cleaning process is performed on the carrier substrate before forming the charge accumulation preventing layer on the carrier substrate or before bonding the carrier substrate, so as to remove native oxide layer that may exist on the surface of the carrier substrate. Through disposing the charge accumulation preventing layer and removing the native oxide layer, undesired conductive channel can be avoided from being generated due to charge accumulation on the surface of the carrier substrate, thereby improving the performance of the semiconductor device. In the embodiments in which the semiconductor device is a bulk acoustic wave resonator, such a configuration can avoid radio frequency loss of the resonator, thereby improving the quality factor (Q) of the resonator.

Figure 1A:
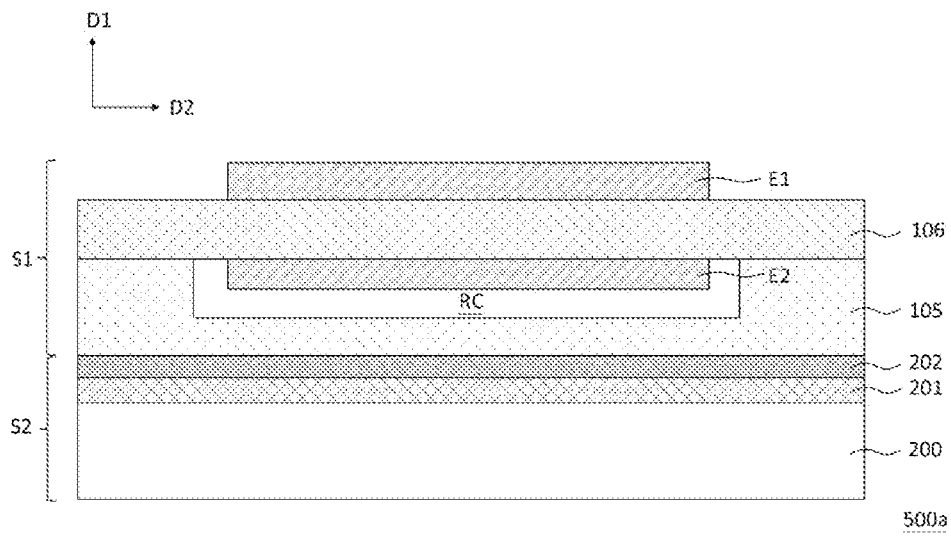
FIG. 1A to FIG. 1G illustrate schematic cross-sectional views of semiconductor devices according to some embodiments of the present disclosure.

FIG. 1A illustrates a schematic cross-sectional view of a semiconductor device according to some embodiments of the present disclosure.

Referring to FIG. 1A, in some embodiments, a semiconductor device 500a includes a sub-semiconductor structure S1 and a sub-semiconductor structure S2, the sub-semiconductor structure S1 is disposed on and bonded to the sub-semiconductor structure S2. For example, the sub-semiconductor structure S2 may include a carrier substrate 200, a barrier layer 201 and a buffer layer 202. In some embodiments, the semiconductor device 500a is a bulk acoustic wave resonator, and the sub-semiconductor structure S1 includes a piezoelectric layer 106, electrodes E1 and E2 formed on opposite sides of piezoelectric layer 106, and a dielectric layer 105. In addition, the semiconductor device 500a may further have a cavity RC. In some embodiments, the cavity RC is disposed within the sub-semiconductor structure S1, but the present disclosure is not limited thereto.

In some embodiments, the carrier substrate 200 is a semiconductor substrate, and may include a suitable semiconductor material such as silicon (e.g., monocrystalline silicon). For example, the carrier substrate 200 may include a high resistance silicon material. In some embodiments, a barrier layer 201 is disposed on the carrier substrate 200. The barrier layer 201 may serve as a charge accumulation preventing layer and is configured to prevent charge from being accumulated on the surface of the carrier substrate 200 and thus prevent the generation of undesired conductive channel on the surface of the carrier substrate 200. In some embodiments, the barrier layer 201 is a non-electron-rich layer, for example, the barrier layer 201 includes a non-conductive and non-silicon-oxide-based material, and may be a non-conductive and non-silicon-oxide layer, i.e., the barrier layer 201 does not include a conductive material and does not include a silicon oxide based material (e.g., silicon oxide, silica, etc.); in some embodiments, the barrier layer 201 may include a semiconductor material, a dielectric material or a combination thereof, such as polysilicon, amorphous silicon, silicon nitride, aluminum nitride, silicon carbide, gallium nitride, the like or combinations thereof, but the present disclosure is not limited thereto, any material that can avoid the formation of charge accumulation and avoid the generation of undesired conductive channel on the surface of the carrier substrate 200 can be used to form the barrier layer 201 and is within the scope of embodiments of the present disclosure.

In some embodiments, there is no silicon oxide layer, $SiO_x$ layer, material based on silicon oxide or $SiO_x$, or the like between the carrier substrate 200 and the barrier layer 201. For example, the barrier layer 201 is formed on the side of the carrier substrate 200 close to the sub-semiconductor structure S1, and is in direct contact (or physical contact) with the carrier substrate 200, that is, there is free of other material layers between the carrier substrate 200 and the barrier layer 201. That is to say, at least the main surface (e.g., top surface) of the carrier substrate 200 does not have silicon oxide or silicon-oxide-based material existed thereon.

In some embodiments, a buffer layer 202 is disposed on the side of the barrier layer 201 away from the carrier substrate 200. The buffer layer 202 is a non-conductive material, and may include a suitable dielectric material, such as silicon nitride (SiN), silicon oxide ($SiO_2$), aluminum nitride (AlN), the like, or combinations thereof. The buffer layer 202 may be a single-layer structure or a multi-layer structure, and in the case where the buffer layer 202 is a multi-layer structure, the buffer layer 202 may be a stack layer including a combination of two or more than two of the above-mentioned materials. In this embodiment, the buffer layer 202 is configured to create a bonding condition, and balance the warpage of the carrier substrate 200, for example, one of the buffer layer 202 and the barrier layer 201 has tensile stress, while the other one of the buffer layer 202 and the barrier layer 201 has compressive stress, and the warpage of the carrier substrate 200 can thus be balanced. For example, the buffer layer 202 has a substantially flat surface (e.g., top surface) to facilitate subsequent bonding process. For example, since the buffer layer 202 is disposed on the barrier layer 201, such that the buffer layer 202 has a substantially flat surface, it is advantage for the bonding between the buffer layer 202 and the dielectric layer 105 of the sub-semiconductor structure S1. In the embodiments in which the buffer layer 202 includes silicon oxide, since the barrier layer 201 is disposed between the buffer layer 202 and the carrier substrate 200 and separate the buffer layer 202 apart from the carrier substrate 200, as such, the carrier substrate 200 does not contact the buffer layer 200, and there is no contact interface existed between monocrystalline silicon and silicon oxide at the surface of the carrier substrate 200, thereby avoiding the generation of undesired conduction channel due to charge accumulation at the contact interface between monocrystalline silicon and silicon oxide.

Still referring to FIG. 1A, in some embodiments, the piezoelectric layer 106 includes a suitable piezoelectric material, such as aluminum nitride (AlN), scandium-doped aluminum nitride (ScAlN), zinc oxide, lithium niobate, lithium tantalate or other materials with piezoelectric properties, but the present disclosure is not limited thereto. The electrode E1 and the electrode E2 are disposed on opposite sides of piezoelectric layer 106 in a direction D1 perpendicular to the main surface (e.g., top surface) of carrier substrate 200. For example, the electrode E1 is disposed on the side of the piezoelectric layer 106 away from the carrier substrate 200, and the electrode E2 is disposed on the side of the piezoelectric layer 106 close to the carrier substrate 200; the electrode E1 and the electrode E2 may be referred to as a first electrode and a second electrode, respectively, or vice versa. The electrodes E1 and E2 may each include a suitable electrode material, for example, each include a metallic material such as molybdenum (Mo), aluminum (Al), copper (Cu), platinum (Pt), tantalum (Ta), tungsten (W), palladium (Pd), ruthenium (Ru), the like, alloys thereof, or combinations thereof.

In some embodiments, the dielectric layer 105 is disposed on the side of the piezoelectric layer 106 away from the electrode E1 and close to the sub-semiconductor structure S2 and is bonded to the buffer layer 202. The dielectric layer 105 and the electrode E2 are disposed on the same side of the piezoelectric layer 106 and may be spaced apart from each other in a direction parallel to the main surface of the carrier substrate 200. The dielectric layer 105 includes a non-conductive material, and may be a single-layer structure or a stack layer including two or more layers of non-conductive materials. For example, the dielectric layer 105 may include a dielectric material such as silicon oxide ($SiO_2$), silicon nitride (SiN), aluminum nitride (AN), gallium nitride (GaN), the like, or combinations thereof.

In some embodiments, the cavity RC is formed between the dielectric layer 105 and the piezoelectric layer 106 of the sub-semiconductor structure S1; the cavity RC may have sidewalls defined by the dielectric layer 105, and facing surfaces defined by the piezoelectric layer 106 and the dielectric layer 105 (e.g., the top and bottom surfaces shown in the figure); in other words, the cavity RC is laterally surrounded by the dielectric layer 105 in the direction D2 perpendicular to the main surface of the carrier substrate 200, and the cavity RC is defined between the facing surfaces of the piezoelectric layer 106 and the dielectric layer 105 in the direction perpendicular to the main surface of the carrier substrate 200. Herein, "facing surfaces" refers to surfaces that faces each other. In some embodiments, at least a portion of the electrode E2 is disposed in the cavity RC, but the present disclosure is not limited thereto. The piezoelectric layer 106, the electrodes E1 and E2 and the cavity RC at least partially overlap with each other in the direction D1 perpendicular to the main surface of piezoelectric layer 106.

In this embodiment, through forming the barrier layer 201 on the carrier substrate 200, such that no electron-rich material such as silicon oxide is included in the barrier layer 201 and between the barrier layer 201 and the carrier substrate 200, and the barrier layer 201 separates the carrier substrate 200 apart from overlying material layers that may include silicon oxide (e.g., the buffer layer 202, the dielectric layer 105), the semiconductor material of the carrier substrate 200 is avoided from contacting or attaching to electron-rich material such as silicon oxide, i.e., such that the surface of the carrier substrate 200 does not present contact interface between a semiconductor material and an electron-rich material (e.g., a contact interface between monocrystalline silicon and silicon oxide) that may generate charge accumulation, in this way, the semiconductor material (e.g., monocrystalline silicon) of the carrier substrate 200 can be prevented from trapping electrons from the electron-rich material (e.g., silicon oxide), thereby avoiding undesired conductive channel from being generated due to charge accumulation at the surface of the carrier substrate 200, and improving the performance of semiconductor device. For example, in the embodiments in which the semiconductor device is a bulk acoustic wave resonator, such a configuration can avoid radio frequency loss of the resonator and the filter formed from the resonator, thereby improving the performance of the resonator and the filter.

FIG. 1B to FIG. 1G illustrate schematic cross-sectional views of semiconductor devices according to some other embodiments of the present disclosure. The semiconductor devices illustrated in FIG. 1B to FIG. 1G are similar to the semiconductor device illustrated in FIG. 1A, except that the structure between the carrier substrate 200 and the dielectric layer 105 is different, and the difference will be described in detail below, while features similar to the above-described embodiment will not be repeated. It should be noted that, the candidate materials used for the material layers denoted by the same reference numerals in various embodiments are the same or similar, and the related materials are not repeatedly described in each embodiment, and may refer to those described in previous embodiments.

Figure 1B:
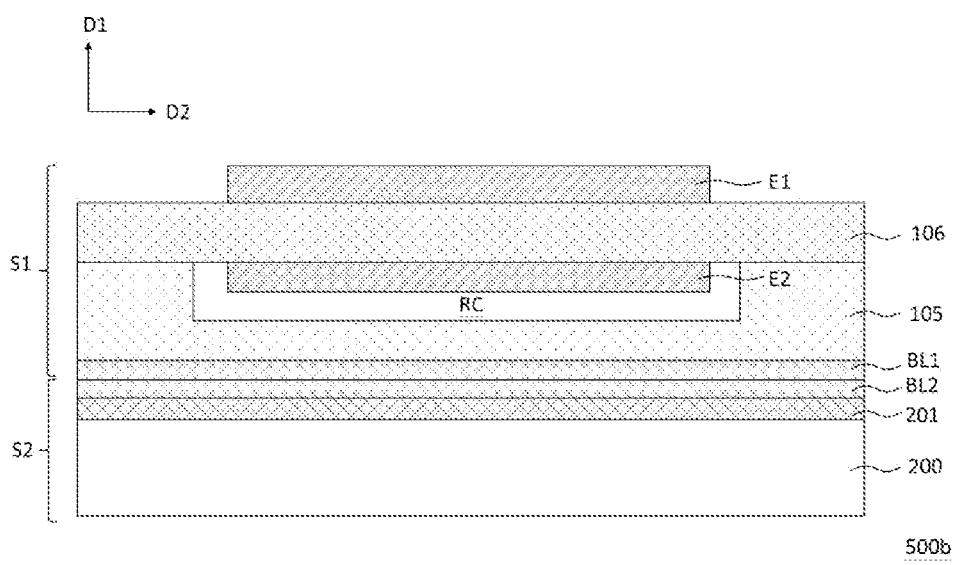

Referring to FIG. 1B, a semiconductor device 500b includes a sub-semiconductor structure S1 and a sub-semiconductor structure S2. In some embodiments, the sub-semiconductor structure S2 includes a carrier substrate 200, a barrier layer 201, and a bonding layer BL2, the barrier layer 201 is disposed on a surface of the carrier substrate 200 at a side close to the sub-semiconductor structure S1, and the bonding layer BL2 is disposed on a side of the barrier layer 201 away from the carrier substrate 200; in addition, the sub-semiconductor structure S1 may further include a bonding layer BL1, and the bonding layer BL1 is disposed on a side of the dielectric layer 105 away from the piezoelectric layer 106 and close to the sub-semiconductor structure S2. In some embodiments, the bonding layer BL1 and the bonding layer BL2 may each include a semiconductor material, such as amorphous silicon, but the present disclosure is not limited thereto.

In some embodiments, the barrier layer 201 serves as a charge accumulation preventing layer, and may be a single-layer structure or a multi-layer structure including at least two layers of materials. At least a surface layer of the barrier layer 201 contacting the carrier substrate 200 is a non-electron-rich material, for example, is a non-conductive and non-silicon-oxide layer. For example, the barrier layer 201 includes a non-conductive material, and may include, for example, a semiconductor material, a dielectric material, or a combination thereof. For example, the barrier layer 201 may include polysilicon, amorphous silicon, SiN, AlN, silicon carbide (SiC), GaN, silicon oxide (SiO$_2$), the like, or combinations thereof. In the case where the barrier layer 201 is a single-layer structure, the material of the barrier layer 201 does not include silicon oxide, that is, the material of the barrier layer 201 can be selected from the above-mentioned materials other than silicon oxide; in the case where the barrier layer 201 is a multi-layer structure, the material of the layer of the barrier layer 201 contacting the carrier substrate 200 does not include silicon oxide, that is, can be selected from the above-mentioned materials other than silicon oxide, while the other layers of the barrier layer 201 (e.g., the layers away from the main surface of the carrier substrate 200) may be selected from any of the above-mentioned materials, and may include silicon oxide. Such a configuration can prevent the surface of the carrier substrate 200 from being in contact with an electron-rich material (e.g., silicon oxide), and thus avoid forming a contact interface between the semiconductor material and the electron-rich material (e.g., contact interface between monocrystalline silicon and silicon oxide) that may generate charge accumulation, thereby avoiding undesired conductive channel from being generated due to charge accumulation on the surface of the carrier substrate 200, and thereby improving the performance of the semiconductor device, for example, in the case where the semiconductor device is or includes a resonator, the quality factor of the resonator can be improved.

Figure 1C:
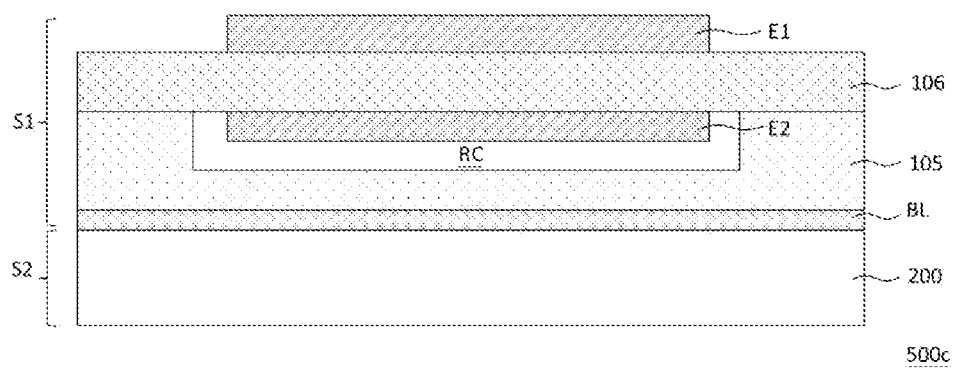

Referring to FIG. 1C, in some embodiments, the semiconductor device 500c includes sub-semiconductor structures S1 and S2, and either of the sub-semiconductor structures S1 and S2 may include a bonding layer. In this embodiment, the barrier layer 201 is omitted from the sub-semiconductor structure S2, and a bonding layer BL is disposed between the carrier substrate 200 and the dielectric layer 105. The bonding layer BL is disposed on a side of the dielectric layer 105 close to the carrier substrate 200, and may be in direct contact with the carrier substrate 200. There may be free of other material layers between the bonding layer BL and the substrate 200. In this embodiment, the bonding layer BL serves as a charge accumulation preventing layer, and the bonding layer BL includes a non-electron-rich material, at least a surface layer of the bonding layer BL contacting the carrier substrate 200 does not include an electron-rich material, or the entire bonding layer BL may not include the electron-rich material; the bonding layer BL may include a non-conductive material, and may include a semiconductor material, a dielectric material, or a combination thereof. For example, the bonding layer BL may include amorphous silicon. In this embodiment, the bonding layer BL serves as the charge accumulation preventing layer, and there is free of electron-rich material (e.g., silicon oxide, SiO$_x$, or silicon oxide based material) at least both on the surface of the bonding layer BL close to the carrier substrate 200 and between the bonding layer BL and the carrier substrate 200. Further, the bonding layer BL separates the carrier substrate 200 apart from the overlying layers that may include an electron-rich material (e.g., the dielectric layer 105 that may include silicon oxide). That is to say, there is no contact interface between a semiconductor material and an electron-rich material (e.g., contact interface between monocrystalline silicon and silicon oxide) that may generate charge accumulation existed on the surface of the carrier substrate 200, as such, undesired conductive channel can be avoided from being generated due to charge accumulation on the surface of the carrier substrate 200, thereby improving the performance (e.g., quality factor) of the semiconductor device (e.g., bulk acoustic wave resonator, filter). In this embodiment, the bonding layer BL serves as both the bonding material and the charge accumulation preventing layer. In some embodiments, the bonding layer BL may be a bonding layer included in either one of the sub-semiconductor structures S1 and S2, for example, the bonding layer BL is included in the sub-semiconductor structure S1 and formed on a side of the dielectric layer 105 close to the sub-semiconductor structure S2; alternatively, in some other embodiments, the bonding layer BL may be included in the sub-semiconductor structure S2 and formed on a side of the carrier substrate 200 close to the sub-semiconductor structure S1.

Figure 1D:
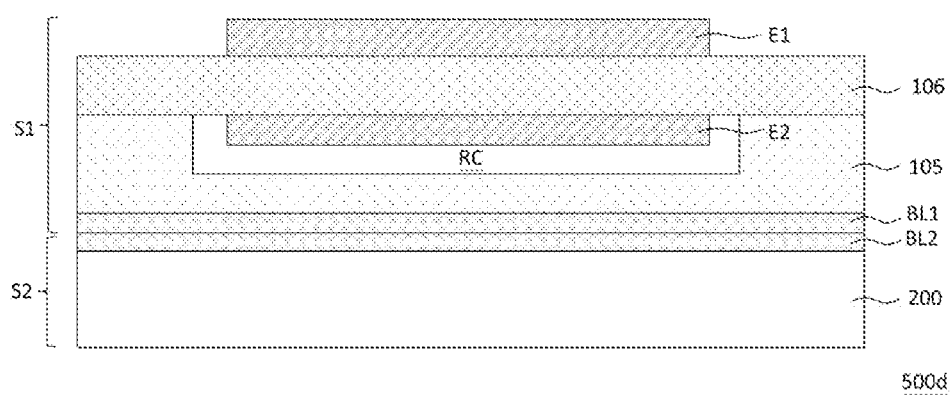

Referring to FIG. 1D, in some embodiments, the semiconductor device 500d includes sub-semiconductor structures S1 and S2, the barrier layer is omitted from the sub-semiconductor structure S2, and the sub-semiconductor structures S1 and S2 may respectively include a bonding layer BL1 and a bonding layer BL2. For example, the bonding layer BL1 and the bonding layer BL2 may be disposed between the dielectric layer 105 and the carrier substrate 200, the bonding layer BL1 is disposed on a side of the dielectric layer 105 close to the sub-semiconductor structure S2, the bonding layer BL2 is disposed on a side of the carrier substrate 200 close to the sub-semiconductor structure S1. In this embodiment, the bonding layer BL2 is directly disposed on and in direct contact with the carrier substrate 200, and there may be free of other material layers between the bonding layer BL2 and the carrier substrate 200. The function of the bonding layer BL2 is similar to that of the bonding layer BL in the semiconductor device 500c illustrated in FIG. 1C. For example, the bonding layer BL2 serves as both a bonding material and a charge accumulation preventing layer. At least the surface layer of the bonding layer BL2 in contact with the carrier substrate 200 does not include an electron-rich material (e.g., silicon oxide) or the bonding layer BL2 does not include an electron-rich material at all, and the material of the bonding layer BL2 may be selected from the candidate materials of the bonding layer BL in the above-described semiconductor device 500c, and the material of the bonding layer BL1 may be the same as or different from the material of the bonding layer BL2. For example, the bonding layers BL1 and BL2 are non-conductive layers, and may include semiconductor materials, such as amorphous silicon, but the present disclosure is not limited thereto. In this embodiment, there is free of electron-rich material (silicon oxide layer, $SiO_x$ layer, silicon oxide based layer, or the like) at least in the surface layer of the bonding layer BL2 that is in contact with the carrier substrate 200 and between the bonding layer BL2 and the carrier substrate 200. That is to say, there is no contact interface between a semiconductor material and an electron-rich material (e.g., contact interface between monocrystalline silicon and silicon oxide) that may generate charge accumulation on the surface of the carrier substrate 200, as such, undesired conductive channel generated due to charge accumulation is avoided on the surface of the carrier substrate 200, thereby improving the performance (e.g., the quality factor) of semiconductor device (e.g., bulk acoustic wave resonator, filter).

Figure 1E:
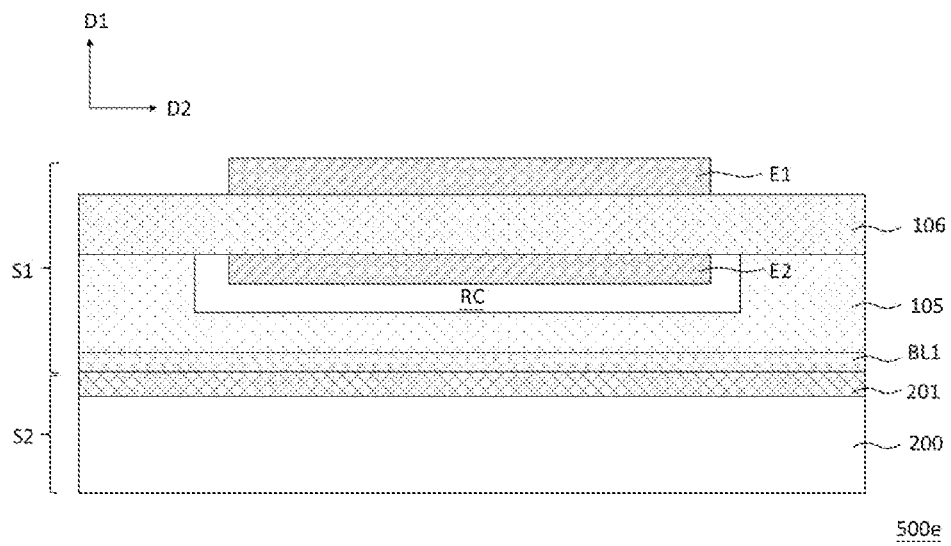

Referring to FIG. 1E, a semiconductor device 500e is similar to the semiconductor device 500b shown in FIG. 1B, except that the bonding layer BL2 is omitted from the sub-semiconductor structure S2 of the semiconductor device 500e. In some embodiments, the bonding layer BL1 is disposed between the dielectric layer 105 and the barrier layer 201, and is in contact with the barrier layer 201. The candidate materials for the barrier layer 201 and the bonding layer BL1 are similar to those described in the previous embodiments (e.g., the embodiment illustrated in FIG. 1B). In this embodiment, similar to the embodiment described with reference to FIG. 1B, the barrier layer 201 serves as the charge accumulation preventing layer, and is configured to avoid generating undesired conductive channel due to charge accumulation on the surface of the carrier substrate 200. In addition, the barrier layer 201 also serves as a bonding material for bonding to the bonding layer BL1. In some embodiments, the barrier layer 201 may be a single-layer structure or a multi-layer structure, and the material of the barrier layer 201 may be selected from at least one of polysilicon, amorphous silicon, SiN, AlN, SiC, GaN, silicon oxide. For example, in the case where the barrier layer 201 is a single-layer structure, the material of the barrier layer 201 may be polysilicon or amorphous silicon, and in the case where the barrier layer 201 is a multi-layer structure, the barrier layer 201 may be a stack layer constituted by a plurality of materials selected from the above materials, and the surface layer of the barrier layer 201 in direct contact with the carrier substrate 200 does not include silicon oxide, while the material of the barrier layer 201 at a side away from the carrier substrate 200 (e.g., the surface layer close to the bonding layer BL1 or contacting the bonding layer BL1) may be polysilicon or amorphous silicon.

Figure 1F:
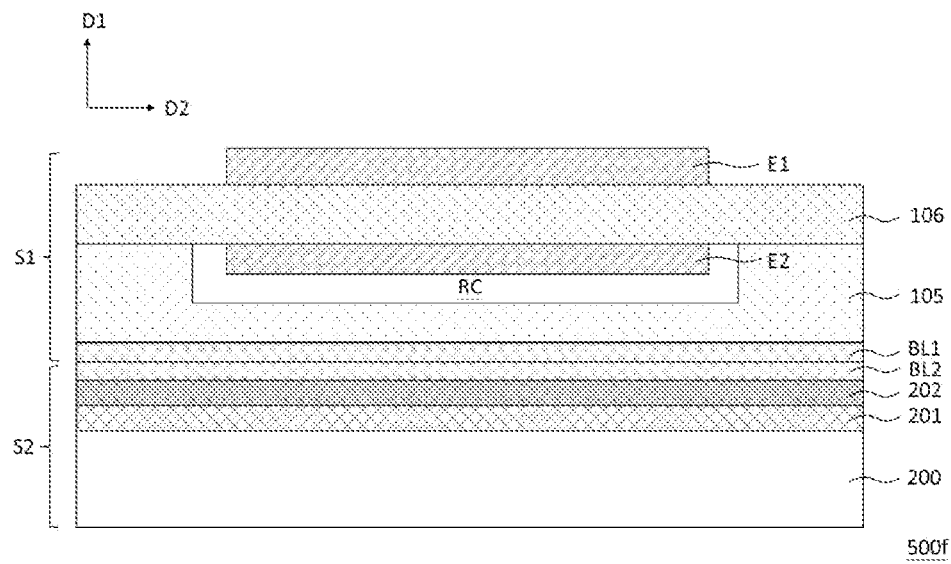

Referring to FIG. 1F, in some embodiments, a semiconductor device 500f is similar to the semiconductor device 500b illustrated in FIG. 1B, except that the sub-semiconductor structure S2 further includes a buffer layer 202 disposed between the barrier layer 201 and the bonding layer BL2. In this embodiment, similar to the semiconductor device 500b, the barrier layer 201 may be in direct contact with the carrier substrate 200, and serve as the charge accumulation preventing layer, so as to prevent undesired conductive channel from being generated due to charge accumulation on the surface of the carrier substrate 200, thereby improving the performance of semiconductor device. The buffer layer 202 is disposed on a side of the barrier layer 201 close to the bonding layer BL2. In this embodiment, the buffer layer 202 is configured to create bonding condition, balance the warpage of the carrier substrate 200, and, for example, have a substantially flat surface (e.g., top surface) to facilitate subsequent bonding. For example, one of the buffer layer 202 and the barrier layer 201 has tensile stress, and the other one of the buffer layer 202 and the barrier layer 201 has compressive stress, so that the warpage of the carrier substrate 200 can be balanced. For example, since the buffer layer 202 is disposed on the barrier layer 201, and the buffer layer 202 has a substantially flat surface, the bonding layer BL2 formed on the buffer layer 202 can also have a substantially flat surface (e.g., top surface) to facilitate the bonding of the bonding layer BL2 and the bonding layer BL1. The candidate materials for the barrier layer 201, the buffer layer 202 and the bonding layers BL1, BL2 are similar to those described in the previous embodiments. In some embodiments, the material of the barrier layer 201 may be a non-conductive and non-silicon-oxide material, for example, including at least one of polysilicon, amorphous silicon, silicon nitride, aluminum nitride, and gallium nitride; the material of the buffer layer may include at least one of silicon nitride, silicon oxide, and aluminum nitride. However, the present disclosure is not limited thereto.

Figure 1G:
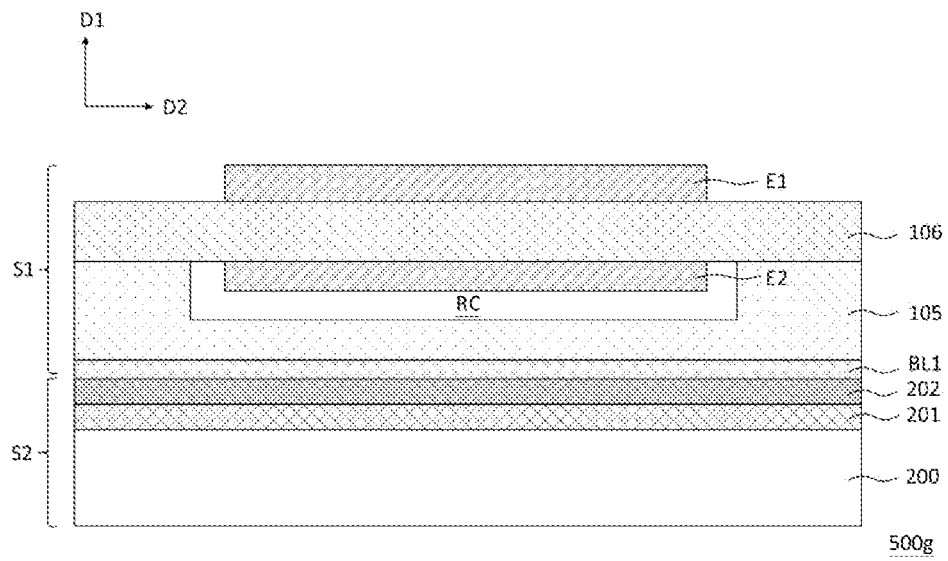

Referring to FIG. 1G, a semiconductor device 500g is similar to the semiconductor device 500a illustrated in FIG. 1A, except that the sub-semiconductor structure S1 in the semiconductor device 500g further includes a bonding layer BL1, and the bonding layer BL1 is disposed on a side of the dielectric layer 105 close to the sub-semiconductor structure S2 and in contact with the buffer layer 202. The material of the bonding layer BL1 is similar to that described in the previous embodiment, and includes, for example, amorphous silicon. In some embodiments, the material of the buffer layer 202 includes at least one of non-conductive materials such as silicon nitride, silicon oxide, aluminum nitride, polysilicon, amorphous silicon, and the like. The buffer layer 202 may be a single-layer structure or a multi-layer structure. For example, in the case where the buffer layer 202 is a single-layer structure, the material of the buffer layer 202 may be polysilicon or amorphous silicon; in the case where the buffer layer 202 is a multi-layer structure, the material of the outermost surface layer of the buffer layer 202 at the side away from the carrier substrate 200 and the barrier layer 201 (e.g., the surface layer at the side close to the bonding layer BL1, or in contact with the bonding layer BL1) may be polysilicon or amorphous silicon, but the present disclosure is not limited thereto. In this embodiment, similar to the semiconductor device 500*a*, the barrier layer 201 is in direct contact with the carrier substrate 200 and serves as the charge accumulation preventing layer to avoid undesired conductive channel from being generated due to charge accumulation on the surface of the carrier substrate 200, thereby improving the performance of the semiconductor device.

FIG. 2A to FIG. 2K are schematic cross-sectional views illustrating various stages in a method of forming a semiconductor device according to some embodiments of the present disclosure. The forming method is briefly described below taking the semiconductor device 500*a* as an example.

Figure 2A:
FIG. 2A to FIG. 2K are schematic cross-sectional views illustrating various stages in a method of forming a semiconductor device according to some embodiments of the present disclosure.

Referring to FIG. 2A, a substrate 100 is provided. The substrate 100 may be a semiconductor substrate, such as a silicon substrate, but the present disclosure is not limited thereto. The substrate 100 may also use other suitable materials, as long as it can provide structural support for the subsequently formed overlying layers. The substrate 100 will be removed from the semiconductor device in a subsequent process and may also be referred to as a sacrificial substrate.

Figure 2B:
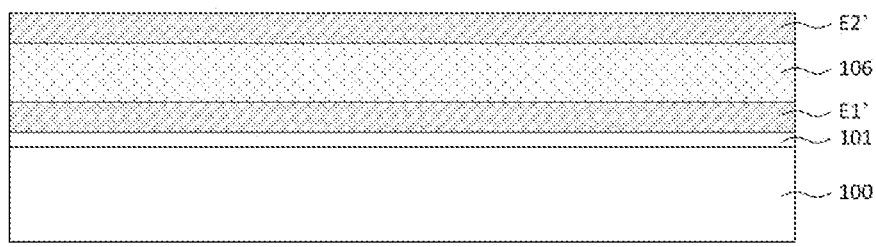

Referring to FIG. 2B, in some embodiments, a dielectric layer 101 is formed on the substrate 100. The dielectric layer 101 may be an oxide layer, for example, including silicon oxide ($SiO_2$). The dielectric layer 101 may be formed by a deposition process such as chemical vapor deposition or a thermal oxidation process. Thereafter, an electrode material layer E1', a piezoelectric layer 106 and an electrode material layer E2' are sequentially formed on the dielectric layer 101. The electrode material layer E1' and the electrode material layer E2' are respectively used to form the above-mentioned electrode E1 and electrode E2, and their respective materials can refer to the materials described above with reference to FIG. 1A, which are not described again here. The electrode material layer E1', the piezoelectric layer 106, and the electrode material layer E2' can be formed using suitable deposition methods, respectively. For example, the electrode material layers E1' and E2' may be formed by physical vapor deposition processes, and the piezoelectric layer 106 may be formed by a chemical vapor deposition process.

Figure 2C:
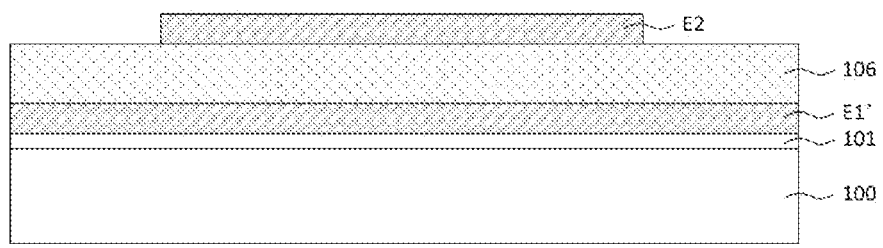
Figure 2D:
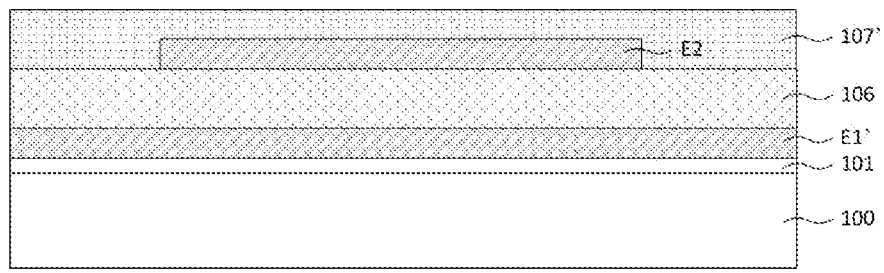

Referring to FIG. 2C and FIG. 2D, a patterning process is performed on the electrode material layer E2' to form the electrode E2. For example, the electrode material layer E2' may be patterned through photolithography and etching processes to remove a portion of the electrode material layer E2' and form the electrode E2. Thereafter, a sacrificial material layer 107' is formed on the electrode E2. In some embodiments, the sacrificial material layer 107' may include a semiconductor material, and may be a single-layer structure or a multi-layer structure, for example, the sacrificial material layer 107' may be or include silicon, polysilicon, amorphous silicon (a-Si), the like, or a stack layer including a combination of the above materials. Alternatively or additionally, the sacrificial material layer 107' may also include a dielectric material. The sacrificial material layer 107' may be formed by a suitable deposition process such as chemical vapor deposition, physical vapor deposition, or the like.

Figure 2E:
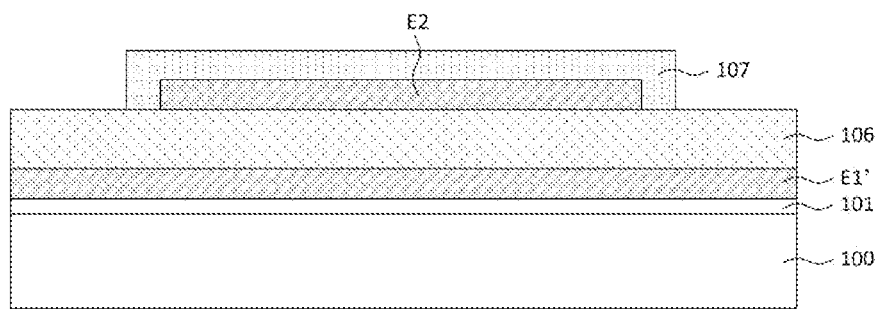

Referring to FIG. 2D to FIG. 2E, a patterning process is performed on the sacrificial material layer 107' to form a sacrificial layer 107. For example, the sacrificial material layer 107' may be patterned through photolithography and etching processes to remove a portion of the sacrificial material layer 107' (e.g., a portion away from the edge of the electrode E2) and form the sacrificial layer 107. The sacrificial layer 107 covers the surface of the electrode E2, such as the sidewall of the electrode E2 and the surface of the electrode E2 at the side away from the piezoelectric layer 106. The sacrificial layer 107 is, for example, used to define the position of the subsequently formed cavity.

Figure 2F:
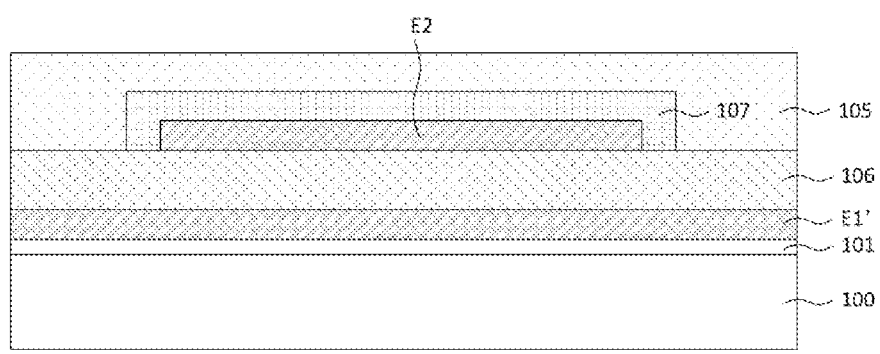

Referring to FIG. 2E to FIG. 2F, a dielectric layer 105 is formed over the substrate 100, the dielectric layer 105 is formed on the side of the piezoelectric layer 106 close to the electrode E2, and covers the sidewalls of the sacrificial layer 107 and the surface of the sacrificial layer 107 at the side away from the piezoelectric layer 106. The dielectric layer 105 may be formed by forming a dielectric material layer using a deposition process such as chemical vapor deposition, and then performing a planarization process (e.g., chemical mechanical polishing (CMP)) on the dielectric material layer. The planarization process is performed such that the dielectric layer 105 has a substantially flat surface at the side away from the piezoelectric layer 106.

Figure 2G:
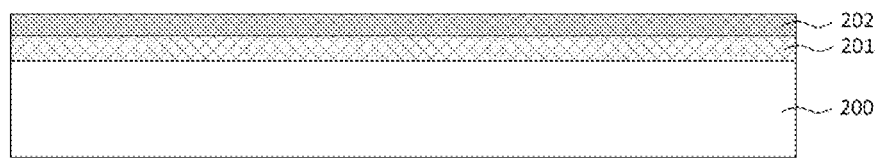

Referring to FIG. 2G, in some embodiments, a carrier substrate 200 is provided, and a barrier layer 201 and a buffer layer 202 are formed on the carrier substrate 200 by a deposition process, for example. The materials of the barrier layer 201 and the buffer layer 202 are the same as those described above with reference to the corresponding embodiments in FIG. 1A to FIG. 1G, and details are not described again here. In some embodiments, a native oxide layer (e.g., native silicon oxide layer) may be existed on the carrier substrate 200. Since silicon oxide is an electron-rich material, before forming the barrier layer 201, a cleaning process (e.g., including an etching process) is performed on the carrier substrate 200 to completely remove the native oxide layer on the surface of the carrier substrate 200, such that the barrier layer 201 is formed to be in direct contact with the semiconductor material (e.g., silicon) of the carrier substrate 200 without electron-rich material such as oxide layer existed therebetween, and there is free of contact interface between a semiconductor material (e.g., monocrystalline silicon) and an electron-rich material (e.g., silicon oxide) between the carrier substrate 200 and the barrier layer 201, thereby preventing undesired conductive channel from being generated due to charge accumulation on the surface of the carrier substrate 200. In some embodiments, the cleaning process may include an etching process, such wet etching and/or dry etching.

The buffer layer 202 may be optionally formed on the side of the barrier layer 201 away from the carrier substrate 200, and the buffer layer 202 has a material and/or a flat surface that facilitates subsequent bonding process. For example, the material of the buffer layer 202 may be similar to the material of the dielectric layer 105, and the materials of the buffer layer 202 and the dielectric layer 105 may be the same or different.

Figure 2H:
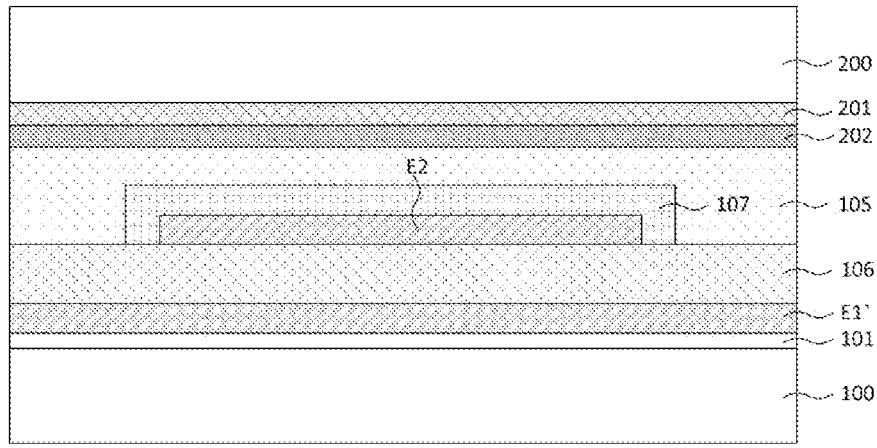

Referring to FIGS. 2G and 2H, the structure shown in FIG. 2G is flipped upside down and bonded to the structure shown in FIG. 2F. For example, the buffer layer 202 and the dielectric layer 105 may be bonded together through a bonding process. The bonding process may, for example, include a fusion bonding process, and the buffer layer 202 and the dielectric layer 105 are bonded together, for example, by dielectric-to-dielectric bonding, but the present disclosure is not limited thereto. Any other suitable bonding process can also be used in this embodiment. In some embodiments, the buffer layer 202 is disposed on the barrier layer 201 to create bonding interface condition. For example, the buffer layer 202 is configured to include a material and surface roughness that are suitable for bonding, thereby facilitating the preforming of the bonding process. In some embodiments, the buffer layer 202 is configured to balance the warpage of the carrier substrate 200; for example, after the barrier layer 201 is formed on the carrier substrate 200, the warpage degree of the substrate may be very large, and the large degree of warpage may lead to failure of smooth bonding or poor bonding quality, if without disposing the buffer layer 202; while in this embodiment, the configuration of the buffer layer 202 can help to balance the warpage of carrier substrate 200, and the buffer layer 202 has a substantially flat bonding surface, which is beneficial to the bonding process and the bonding quality is high. However, the present disclosure is not limited thereto. In some other embodiments, after the barrier layer 201 is formed on the carrier substrate 200, the surface of the barrier layer 201 has condition suitable for bonding and has a substantially flat surface, and thus the buffer layer 202 can be omitted, while the barrier layer 201 and the dielectric layer 105 are bonded together.

Figure 2I:
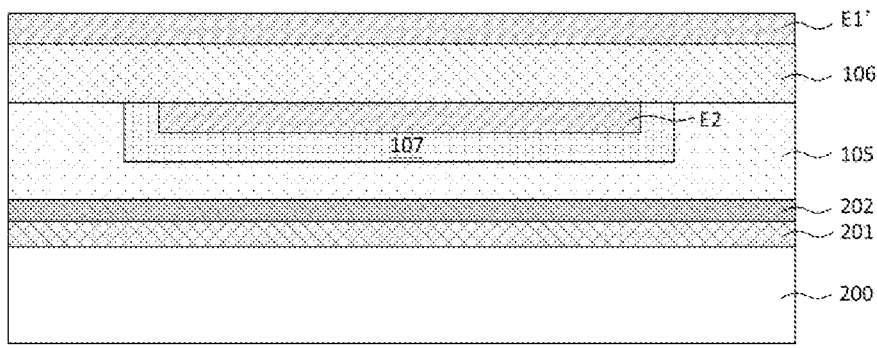

Referring to FIG. 2H and FIG. 2I, the substrate 100 and the dielectric layer 101 are removed. For example, the structure of FIG. 2H is turned over, and the substrate 100 and the dielectric layer 101 are then removed, for example, by a grinding process (e.g., CMP) and/or an etching process, and the surface of the electrode material layer E1' at the side away from the piezoelectric layer 106 is exposed.

Figure 2J:
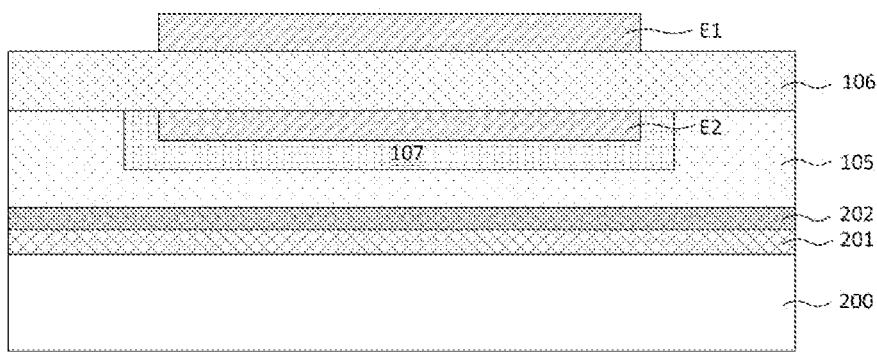
Figure 2K:
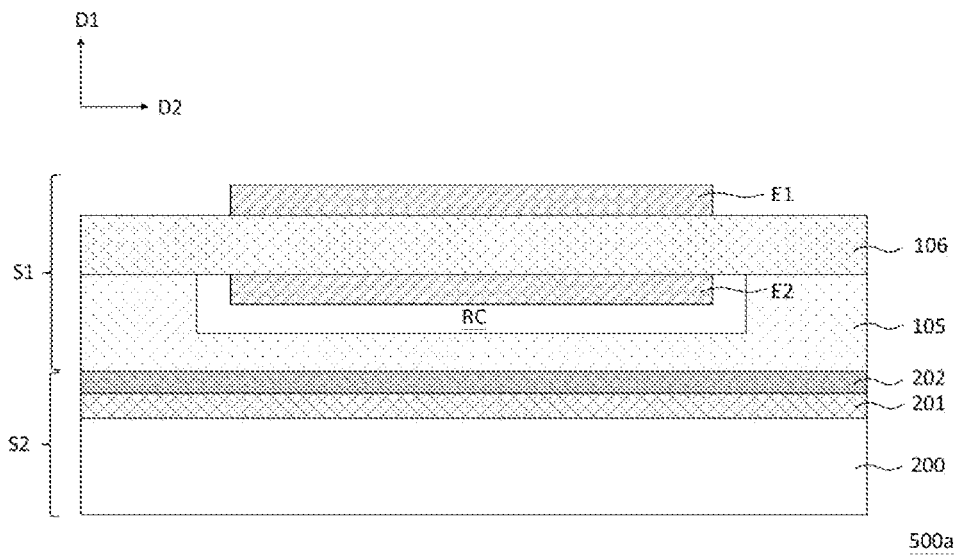

Referring to FIG. 2I and FIG. 2J, a patterning process is performed on the electrode material layer E1' to remove a portion of the electrode material layer E1' and form an electrode E1. The patterning process may include, for example, photolithography and etching processes. Thereafter, as shown in FIG. 2J to FIG. 2K, the sacrificial layer 107 is removed to form a cavity RC. The removal of the sacrificial layer 107 may include an etching process; in some embodiments, a patterning process may be performed on the piezoelectric layer 106 to form release hole(s), and the etchant for etching the sacrificial layer 107 may enter the region where the sacrificial layer 107 is located from the release hole, to remove the sacrificial layer 107 and form a cavity RC in the region previously occupied by the sacrificial layer 107. As such, the semiconductor device 500a including the sub-semiconductor structure S1 and the sub-semiconductor structure S2 is thus formed.

In the semiconductor device 500a, the sub-semiconductor structure S1 includes a piezoelectric layer 106, electrodes E1 and E2 formed on opposite sides of the piezoelectric layer 106, the dielectric layer 105 formed on the side of the piezoelectric layer 106 close to the electrode E2, and the bonding layer BL1 formed on the side of the dielectric layer 105 away from the piezoelectric layer 106; the sub-semiconductor structure S2 includes the carrier substrate 200, and the barrier layer 201 and the buffer layer 202 subsequentially formed on the carrier substrate 200. In this embodiment, the sub-semiconductor structure S1 and the sub-semiconductor structure S2 are bonded together through the bonding of the dielectric layer 105 and the buffer layer 202. However, the present disclosure is not limited thereto.

The forming method of the semiconductor devices 500b-500g is similar to that of the semiconductor device 500a, but the material layers included in the respective semiconductor devices and the bonding manners between the sub-semiconductor structures are slightly different. It should be noted that, in various embodiments of the present disclosure, regardless of whether a material layer is formed on the carrier substrate 200 during the formation of the sub-semiconductor structure S2, and no matter what kind of material layer is formed, a cleaning process is performed on the carrier substrate 200 before forming the material layer or before bonding the carrier substrate to the sub-semiconductor structure S1 (in the embodiments in which no other material layer is formed on the carrier substrate 200), so as to ensure the native oxide layer (e.g., silicon oxide) that may exist on the surface of the carrier substrate 200 is completely removed, and such that there is free of electron-rich material on the surface the carrier substrate 200, thereby avoiding undesired conductive channel from being generated due to charge accumulation on the surface of the carrier substrate 200.

FIG. 3A to FIG. 3F briefly illustrate the bonding manners between the respective sub-semiconductor structures in semiconductor devices 500b-500g (e.g., in a bonding process similar to that of FIG. 2H).

Figure 3A:
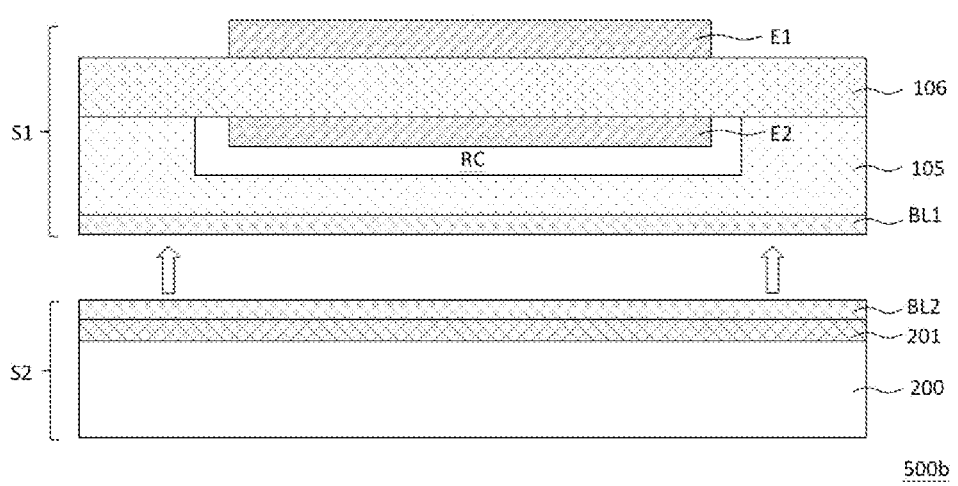
FIG. 3A to FIG. 3F briefly illustrate bonding manners between the sub-semiconductor structures in respective semiconductor devices according to some embodiments of the present disclosure.

Referring to FIG. 3A, in the semiconductor device 500b, the sub-semiconductor structure S1 includes the piezoelectric layer 106, the electrodes E1 and E2 formed on opposite sides of the piezoelectric layer 106, the dielectric layer 105 formed on the side of the piezoelectric layer 106 close to the sub-semiconductor structure S2, and the bonding layer BL1 formed on the side of the dielectric layer 105 away from the piezoelectric layer 106; the sub-semiconductor structure S2 includes the carrier substrate 200 and the barrier layer 201 and the bonding layer BL2 sequentially formed on the carrier substrate 200. The sub-semiconductor structure S1 and the sub-semiconductor structure S2 are bonded together through the bonding of the bonding layer BL1 and the bonding layer BL2 to each other. In some embodiments, the bonding layer BL1 is deposited on the dielectric layer 105, for example, by a physical vapor deposition process (e.g., sputtering) under vacuum, and the bonding layer BL2 is deposited on the barrier layer 201 (e.g., on the surface of the barrier layer 201 at the side away from the carrier substrate 200) by a physical vapor deposition process under vacuum. Before performing the bonding process, the bonding layer BL1 and the bonding layer BL2 are kept from being exposed to the air, and thereafter, the bonding layer BL1 and the bonding layer BL2 are bonded and attached together under vacuum, such that the sub-semiconductor structure S1 and the sub-semiconductor structure S2 are bonded together.

Figure 3B:
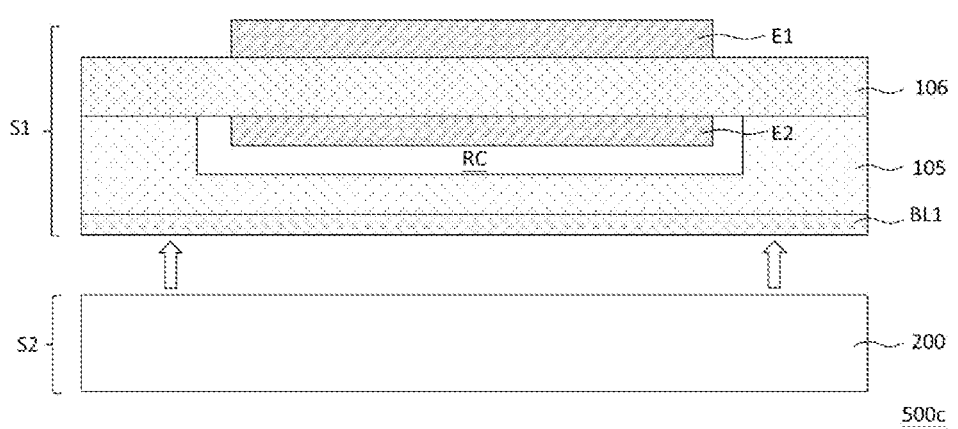

Referring to FIG. 3B, in the semiconductor device 500c, the sub-semiconductor structure S1 includes the piezoelectric layer 106, the electrodes E1 and E2 formed on opposite sides of the piezoelectric layer 106, the dielectric layer 105 formed on the side of the piezoelectric layer 106 close to the sub-semiconductor structure S2, and the bonding layer BL1 formed on the side of the dielectric layer 105 away from the piezoelectric layer 106; the sub-semiconductor structure S2 includes the carrier substrate 200. The sub-semiconductor structure S1 and the sub-semiconductor structure S2 are bonded together through the bonding and attaching of the bonding layer BL1 and the carrier substrate 200 to each other. In some embodiments, the bonding layer BL1 is deposited on the dielectric layer 105 by a physical vapor deposition process under vacuum. In addition, the native oxide layer (e.g., silicon oxide layer) on the surface of the carrier substrate 200 is completely removed under vacuum, such that there is free of silicon oxide on the surface of the carrier substrate 200 or between the carrier substrate 200 and the bonding layer BL1. Before the bonding process, the bonding layer BL1 and the carrier substrate 200 are kept from being exposed to the air, thereafter, the bonding layer BL1 and the carrier substrate 200 are bonded and attached to each other under vacuum, such that the sub-semiconductor structure S1 and sub-semiconductor structure S2 are bonded together.

Figure 3C:
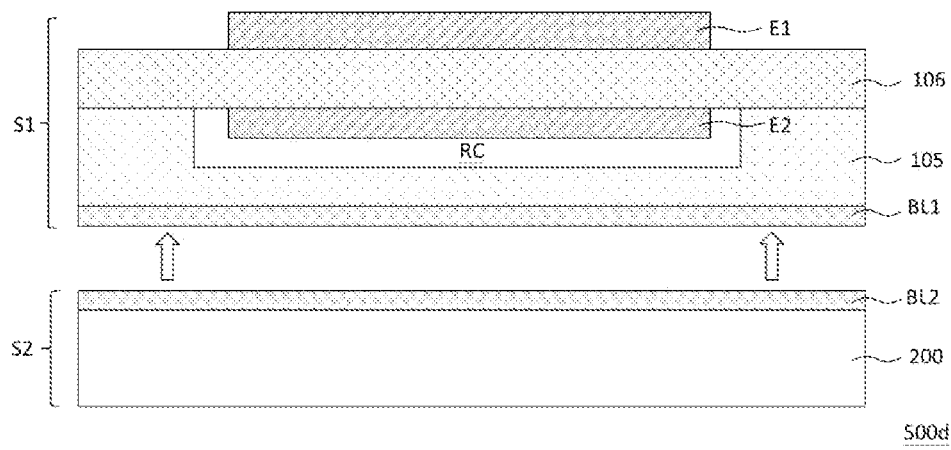

Referring to FIG. 3C, in the semiconductor device 500d, the sub-semiconductor structure S1 includes the piezoelectric layer 106, the electrodes E1 and E2 formed on opposite sides of the piezoelectric layer 106, the dielectric layer 105 formed on the side of the piezoelectric layer 106 close to the sub-semiconductor structure S2, and the bonding layer BL1 formed on the side of the dielectric layer 105 away from the piezoelectric layer 106; the sub-semiconductor structure S2 includes the carrier substrate 200 and the bonding layer BL2 formed on the carrier substrate 200. The sub-semiconductor structure S1 and the sub-semiconductor structure S2 are bonded together through the bonding of the bonding layer BL1 and the bonding layer BL2 to each other. In some embodiments, the bonding layer BL1 is deposited on the dielectric layer 105 by a physical vapor deposition process (e.g., sputtering) under vacuum, and the bonding layer BL2 is deposited on the carrier substrate 200 (e.g., on the surface of the carrier substrate 200 at the side close to the sub-semiconductor structure S1) by a physical vapor deposition process (e.g., sputtering) under vacuum. Before depositing the bonding layer BL2, the native oxide layer on the surface of the carrier substrate 200 is completely removed, such that no electron-rich material such as oxide layer (e.g., silicon oxide layer) is existed on the surface of the carrier substrate 200 or between the carrier substrate 200 and the subsequently formed bonding layer BL2. Before the bonding process, the bonding layer BL1 and the bonding layer BL2 are kept from being exposed to the air, and thereafter, the bonding layer BL1 and the bonding layer BL2 are bonded and attached together under vacuum, such that the sub-semiconductor structure S1 and the sub-semiconductor structure S2 are bonded together.

Figure 3D:
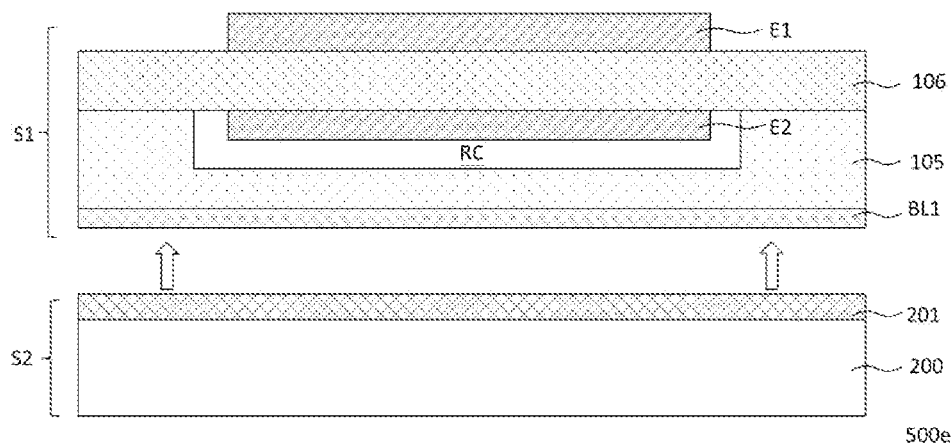

Referring to FIG. 3D, in the semiconductor device 500e, the sub-semiconductor structure S1 includes the piezoelectric layer 106, the electrodes E1 and E2 formed on opposite sides of the piezoelectric layer 106, the dielectric layer 105 formed on the side of the piezoelectric layer 106 close to the sub-semiconductor structure S2, and the bonding layer BL1 formed on the side of the dielectric layer 105 away from the piezoelectric layer 106; the sub-semiconductor structure S2 includes the carrier substrate 200 and the barrier layer 201 formed on the carrier substrate 200. The sub-semiconductor structure S1 and the sub-semiconductor structure S2 are bonded together through the bonding of the bonding layer BL1 and the barrier layer 201 to each other. In some embodiments, the bonding layer BL1 is deposited on the dielectric layer 105 by a physical vapor deposition process under vacuum, and the barrier layer 201 is deposited on the carrier substrate 200 (e.g., on the surface of the carrier substrate 200 at the side close to the sub-semiconductor structure S1) by a physical vapor deposition process under vacuum. Before the bonding process, the bonding layer BL1 and the barrier layer 201 are kept from being exposed to the air, thereafter, the bonding layer BL1 and the barrier layer 201 are bonded together under vacuum, such that the sub-semiconductor structure S1 and the sub-semiconductor structure S2 are bonded together.

Figure 3E:
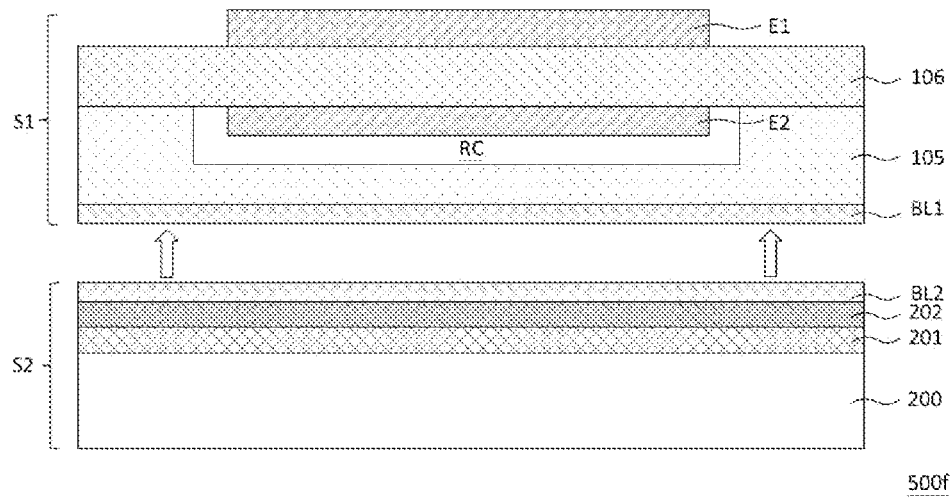
Figure 3F:
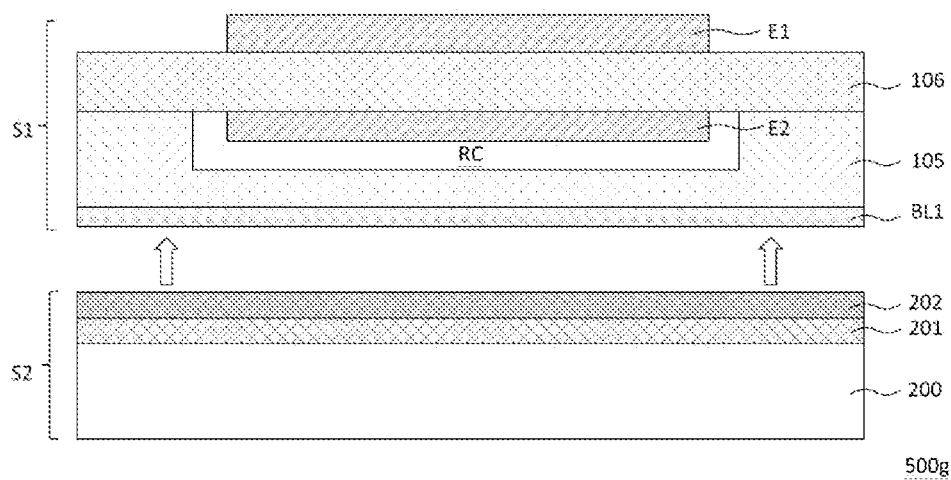

Referring to FIG. 3E, in the semiconductor structure 500f, the sub-semiconductor structure S1 includes the piezoelectric layer 106, the electrodes E1 and E2 formed on opposite sides of the piezoelectric layer 106, the dielectric layer 105 formed on the side of the piezoelectric layer 106 close to the sub-semiconductor structure S2, and the bonding layer BL1 formed on the side of the dielectric layer 105 away from the piezoelectric layer 106; the sub-semiconductor structure S2 includes the carrier substrate 200 and the barrier layer 201, the buffer layer 202 and the bonding layer BL2 sequentially formed on the carrier substrate 200. The sub-semiconductor structure S1 and the sub-semiconductor structure S2 are bonded together through the bonding of the bonding layer BL1 and the bonding layer BL2 to each other. In some embodiments, the bonding layer BL1 is deposited on the dielectric layer 105 by a physical vapor deposition process under vacuum, and the bonding layer BL2 is deposited on the buffer layer 202 (e.g., on the surface of the buffer layer 202 at the side away from the barrier layer 201 and close to the sub-semiconductor structure S1) by a physical vapor deposition process under vacuum. Before the bonding process, the bonding layer BL1 and the bonding layer BL2 are kept from being exposed to the air, and thereafter, the bonding layer BL1 and the bonding layer BL2 are bonded and attached together under vacuum, such that the sub-semiconductor structure S1 and sub-semiconductor structure S2 are bonded together.

Referring to 3F, in the semiconductor device 500g, the sub-semiconductor structure S1 includes the piezoelectric layer 106, the electrodes E1 and E2 formed on opposite sides of the piezoelectric layer 106, the dielectric layer 105 formed on the side of the piezoelectric layer 106 close to the sub-semiconductor structure S2, and the bonding layer BL1 formed on the side of the dielectric layer 105 away from the piezoelectric layer 106; the sub-semiconductor structure S2 includes the carrier substrate 200, and the barrier layer 201 and the buffer layer 202 sequentially formed on the carrier substrate 200. In this embodiment, the sub-semiconductor structure S1 and the sub-semiconductor structure S2 are bonded together through the bonding of the bonding layer BL1 and the buffer layer 202 to each other. In some embodiments, the bonding layer BL1 is deposited on the dielectric layer 105 by a physical vapor deposition process under vacuum, and the buffer layer 202 is deposited on the barrier layer 201 (e.g., on the surface of the barrier layer 201 at the side away from the carrier substrate 200 and close to the sub-semiconductor structure S1) by a physical vapor deposition process under vacuum. Before the bonding process, the bonding layer BL1 and the buffer layer 202 are kept from being exposed to the air, thereafter, the bonding layer BL1 and the buffer layer 202 are bonded together under vacuum, such that the sub-semiconductor structure S1 and the sub-semiconductor structure S2 are bonded together.

In the above-described embodiment, in the embodiment in which the semiconductor device is a bulk acoustic wave resonator, the cavity RC is formed in the sub-semiconductor structure S1 and is defined by the dielectric layer 105 and the piezoelectric layer 106, specifically, in a direction parallel to the main surface of the carrier substrate, the cavity RC is surrounded by the dielectric layer 105, and the dielectric layer 105 has sidewalls facing each other and defining the cavity RC; in a direction perpendicular to the main surface of the carrier substrate 200, the cavity RC is defined between the dielectric layer 105 and the piezoelectric layer 106, and the dielectric layer 105 and the piezoelectric layer 106 have facing surfaces that faces each other and defining the cavity RC. However, the present disclosure is not limited thereto. In some other embodiments, the cavity may also be defined by the combination of the sub-semiconductor structures S1 and S2, for example, the sub-semiconductor structures S1 and S2 enclose to form the cavity RC.

FIG. 4A to FIG. 4G illustrate schematic cross-sectional views of semiconductor devices 600a to 600g according to some other embodiments of the present disclosure. The semiconductor devices 600a-600g are similar to the semiconductor devices 500a-500g shown in FIG. 1A to FIG. 1G, except that the cavities in the semiconductor devices 600a-

600g are defined by both of the sub-semiconductor structures S1 and S2. The differences will be described in detail below, and the structural features of the semiconductor devices 600a-600g similar to the semiconductor devices of the foregoing embodiments (e.g., the sub-semiconductor structures S2 of the semiconductor devices 600a-600g are respectively similar to the sub-semiconductor structures S2 of the above-described semiconductor devices 500a-500g) will not be repeated.

Figure 4A:
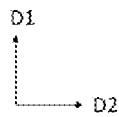
FIG. 4A to FIG. 4G illustrate schematic cross-sectional views of semiconductor devices according to some other embodiments of the present disclosure.
Figure 4A:
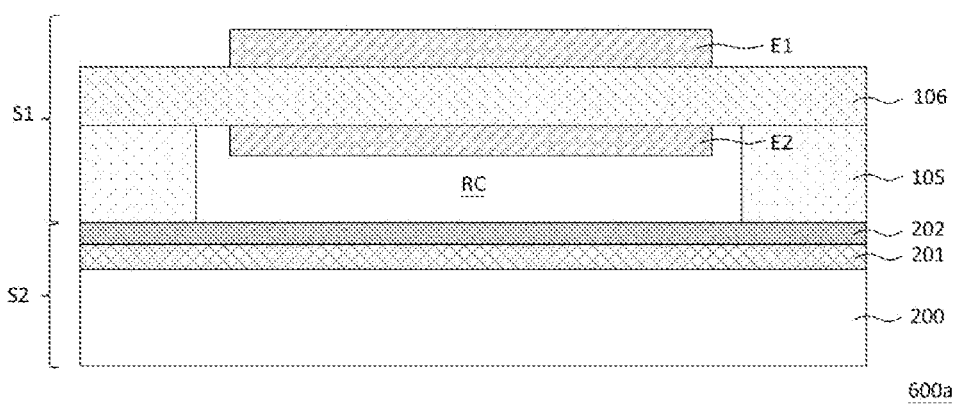

Referring to FIG. 4A, in some embodiments, in the semiconductor device 600a, the cavity RC extends through the dielectric layer 105 and exposes a portion of the surface of the buffer layer 202 at the side away from the carrier substrate 200. That is to say, the cavity RC has a surface defined by the piezoelectric layer 106, the dielectric layer 105, and the buffer layer 202. In a direction D2 parallel to the main surface of the carrier substrate 200, the cavity RC is laterally surrounded by the dielectric layer 105 and exposes sidewalls (e.g., opposite sidewalls) of the dielectric layer 105; in the direction D1 perpendicular to the main surface of the carrier substrate 200, the cavity RC is defined by portions of facing surfaces of the piezoelectric layer 106 and the buffer layer 202 and exposes the portions of facing surfaces of the piezoelectric layer 106 and the buffer layer 202. The other structural features of the semiconductor device 600a are similar to those of the semiconductor device 500a, which are not be described again here.

Figure 4B:
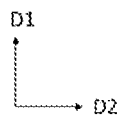
Figure 4B:
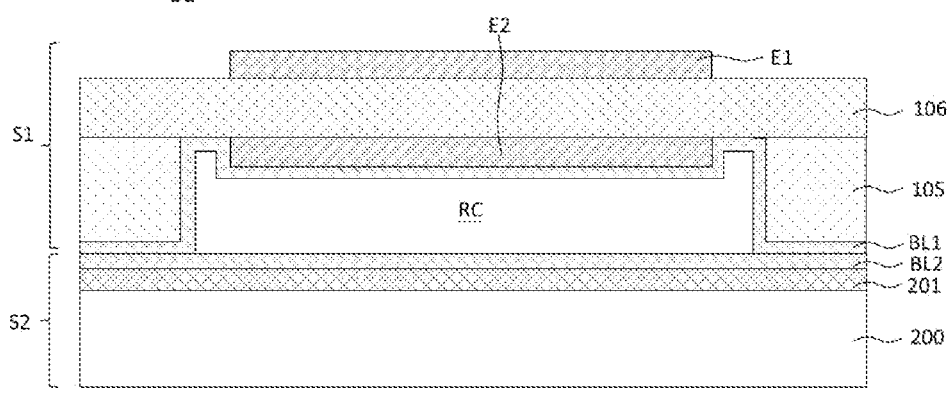

Referring to FIG. 4B, in some embodiments, in the semiconductor device 600b, the cavity RC extends through the dielectric layer 105, and the sub-semiconductor structure S1 further includes a bonding layer BL1, which is disposed between the dielectric layer 105 and the bonding layer BL2, and is further disposed on the sidewalls of the dielectric layer 105, a portion of the surface of the piezoelectric layer 106 at the side away from the electrode E1, the sidewalls of the electrode E2 and the surface of the electrode E2 at the side away from the piezoelectric layer 106, along the contour of the cavity RC; a portion of the bonding layer BL1 is disposed between the electrode E2 and the dielectric layer 105 in a direction D2 parallel to the main surface (e.g., top surface) of the carrier substrate 200. That is to say, the cavity RC is defined by a portion of the surface of the bonding layer BL1 of the sub-semiconductor structure S1 and a portion of the surface of the bonding layer BL2 of the sub-semiconductor structure S2, and is surrounded by the bonding layer BL1 and the bonding layer BL2; specifically, the cavity RC is surrounded by the bonding layer BL1 in the direction D2 parallel to the main surface of the carrier substrate 200 and is defined between the facing surfaces of the bonding layers BL1 and BL2 in the direction D1 perpendicular to the main surface of the carrier substrate 200. Portions of the surfaces of the bonding layers BL1 and BL2 are exposed in the cavity RC, while the sidewalls of the dielectric layer 105, and portions of the surfaces of the electrode E2 and the piezoelectric layer 106 are covered by the bonding layer BL1 and are not exposed in the cavity RC. In this embodiment, portions of the bonding layers BL1 and BL2 (e.g., portions adjacent to the edge of the semiconductor device and away from the cavity RC) are bonded to and in direct contact with each other, while the other portions of the bonding layers BL1 and BL2 are spaced apart from each other (e.g., in the direction D1), and the cavity RC is defined between the other portions of the bonding layers BL1 and BL2, and exposes the surfaces of the other portions of the bonding layers BL1 and BL2.

Referring to FIG. 4C to FIG. 4G, in the semiconductor devices 600c-600g, similar to the semiconductor device 600b, the cavity RC extends through the dielectric layer 105, and the bonding layer BL1 is disposed on the sidewalls of the dielectric layer 105, a portion of the surface of the piezoelectric layer 106 at the side away from the electrode E1, the sidewalls of the electrode E2 and the surface of the electrode E2 at the side away from the piezoelectric layer 106, along the contour of the cavity RC, and the bonding layer BL1 partially defines the cavity RC. The cavity RC is surrounded by the dielectric layer 105 and the bonding layer BL1 in the direction D2, and the bonding layer BL1 is disposed between the dielectric layer 105 and the cavity RC.

Figure 4C:
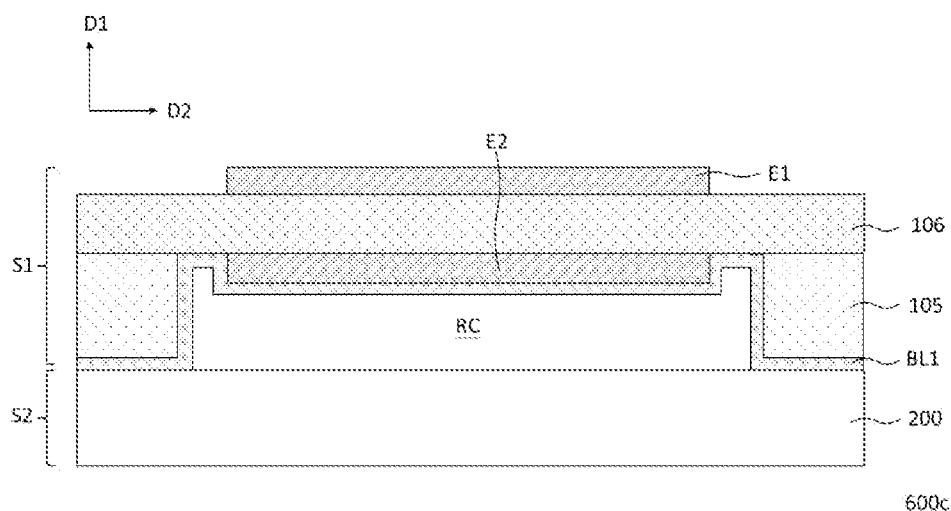

In the semiconductor device 600c illustrated in FIG. 4C, the cavity RC is defined by the bonding layer BL1 of the sub-semiconductor structure S1 and a portion of the surface of the carrier substrate 200 of the sub-semiconductor structure S2; the cavity RC is surrounded by the bonding layer BL1 and defined by the surface of the bonding layer BL1 in the direction D2, and the cavity RC is defined between the facing surfaces of the bonding layer BL1 and carrier substrate 200 in the direction D1. In this embodiment, some portions of the bonding layer BL1 and the carrier substrate 200 are bonded to and in direct contact with each other, while other portions of the bonding layer BL1 and the carrier substrate 200 are spaced from each other (e.g., in the direction D1), the cavity RC is defined between the other portions of the bonding layer BL1 and the carrier substrate 200, and exposes the surfaces of the other portions of the bonding layer BL1 and the carrier substrate 200.

Figure 4D:
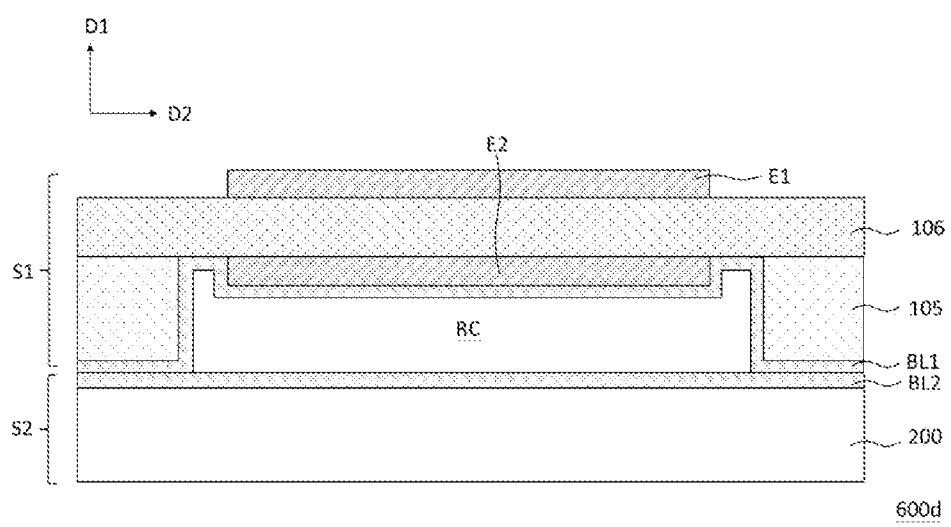

In the semiconductor device 600d illustrated in FIG. 4D, the cavity RC is defined by portions of the surfaces of the bonding layer BL1 of the sub-semiconductor structure S1 and the bonding layer BL2 of the sub-semiconductor structure S2; the cavity RC is surrounded by the bonding layer BL1 and defined by the surface of the bonding layer BL1 in the direction D2, and the cavity RC is defined between the facing surfaces of the bonding layer BL1 and the bonding layer BL2 in the direction D1. In this embodiment, some portions of the bonding layer BL1 and the bonding layer BL2 are bonded to and in direct contact with each other, while the other portions of the bonding layer BL1 and the bonding layer BL2 are spaced apart from each other (e.g., in the direction D1), the cavity RC is defined between the other portions of the bonding layer BL1 and the bonding layer BL2, and exposes the surfaces of the other portions of the bonding layer BL1 and the bonding layer BL2.

Figure 4E:
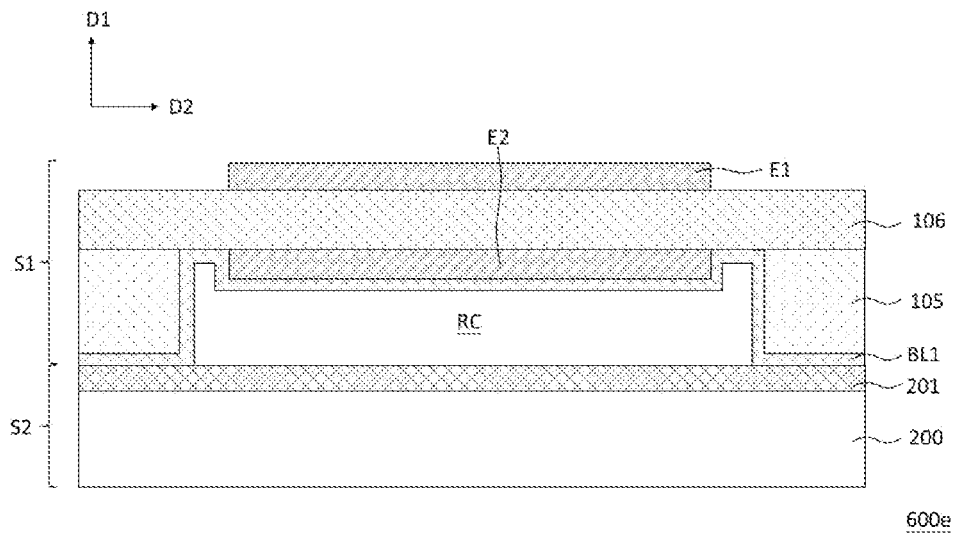

In the semiconductor device 600e illustrated in FIG. 4E, the cavity RC is defined by portions of the surfaces of the bonding layer BL1 of the sub-semiconductor structure S1 and the barrier layer 201 of the sub-semiconductor structure S2; the cavity RC is surrounded by the bonding layer BL1 and defined by the surface of the bonding layer BL1 in the direction D2, and the cavity RC is defined between the facing surfaces of the bonding layer BL1 and barrier layer 201 in the direction D1. In this embodiment, portions of bonding layer BL1 and barrier layer 201 are bonded to and in direct contact with each other, while other portions of bonding layer BL1 and barrier layer 201 are spaced apart from each other (e.g., in the direction D1), the cavity RC is defined between the other portions of the bonding layer BL1 and the barrier layer 201, and exposes the surfaces of the other portions of the bonding layer BL1 and the barrier layer 201.

Figure 4F:
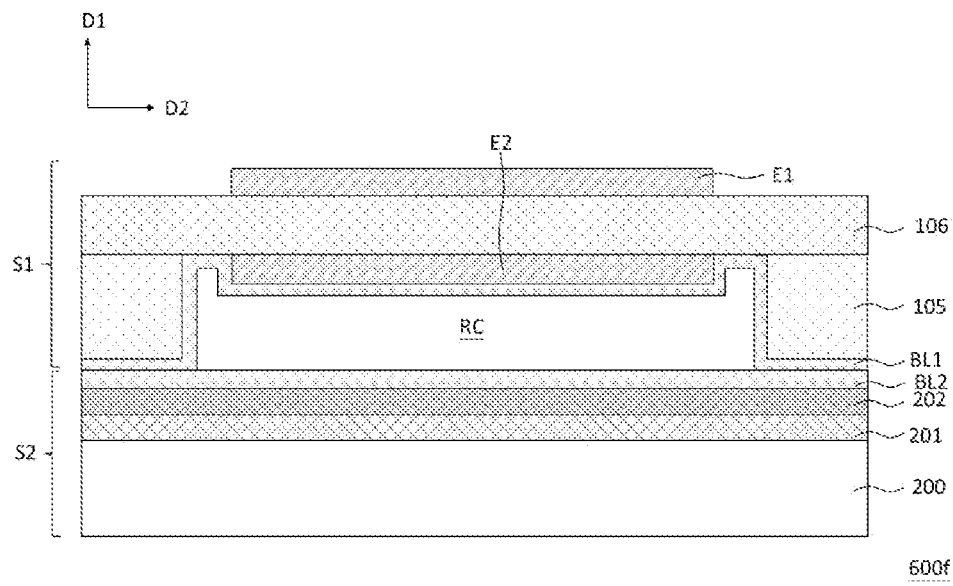

In the semiconductor device 600f illustrated in FIG. 4F, the cavity RC is defined by portions of the surfaces of the bonding layer BL1 of the sub-semiconductor structure S1 and the bonding layer BL2 of the sub-semiconductor structure S2; the cavity RC is surrounded by the bonding layer BL1 and defined by the surface of the bonding layer BL1 in the direction D2, and the cavity RC is defined between the facing surfaces of the bonding layer BL1 and the bonding layer BL2 in the direction D1. In this embodiment, some portions of the bonding layer BL1 and the bonding layer BL2 are bonded to and in direct contact with each other, while other portions of the bonding layer BL1 and the bonding layer BL2 are spaced apart from each other (e.g., in the direction D1), the cavity RC is defined between the other portions of the bonding layer BL1 and the bonding layer BL2, and exposes the surfaces of the other portions of the bonding layer BL1 and the bonding layer BL2.

Figure 4G:
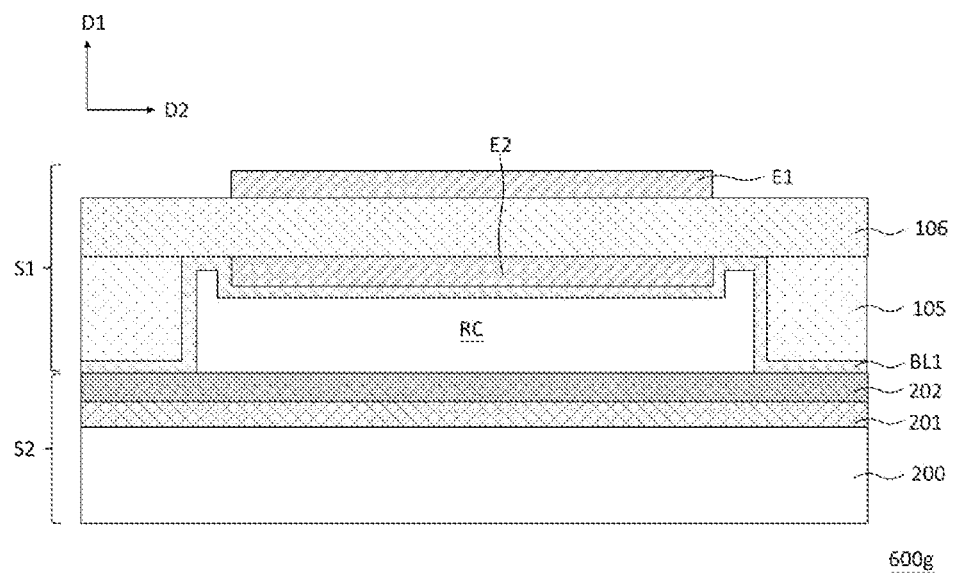

In the semiconductor device 600g illustrated in FIG. 4G, the cavity RC is defined by portions of the surfaces of the bonding layer BL1 of the sub-semiconductor structure S1 and the buffer layer 202 of the sub-semiconductor structure S2; the cavity RC is surrounded by the bonding layer BL1 and defined by the surface of the bonding layer BL1 in the direction D2, and the cavity RC is defined between the facing surfaces of the bonding layer BL1 and the buffer layer 202 in the direction D1. In this embodiment, some portions of the bonding layer BL1 and the buffer layer 202 are bonded to and in direct contact with each other, while other portions of the bonding layer BL1 and the buffer layer 202 are spaced apart from each other (e.g., in the direction D1), the cavity RC is defined between the other portions of the bonding layer BL1 and the buffer layer 202, and exposes the surfaces of the other portions of the bonding layer BL1 and the buffer layer 202.

FIG. 5A to FIG. 5F are schematic cross-sectional views illustrating various stages in a method for forming a semiconductor device according to some other embodiments of the present disclosure, and FIG. 5A to FIG. 5F illustrate the method taking the semiconductor device 600a as an example, the method is similar to the method described with reference to FIG. 2A to FIG. 2K, except that the sacrificial layer is omitted in this embodiment, and the forming method of cavity is different, which is described in detail below.

Figure 5A:
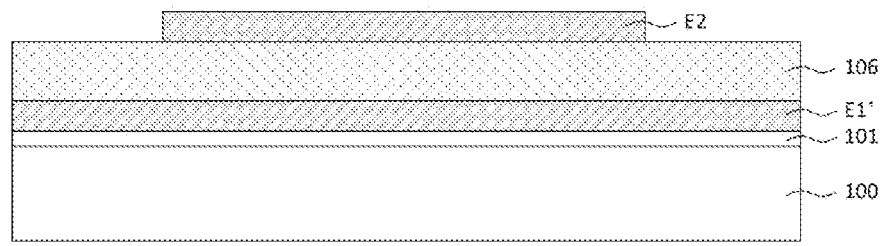
FIG. 5A to FIG. 5F are schematic cross-sectional views illustrating various stages in a method of forming a semiconductor device according to some other embodiments of the present disclosure.
Figure 5B:
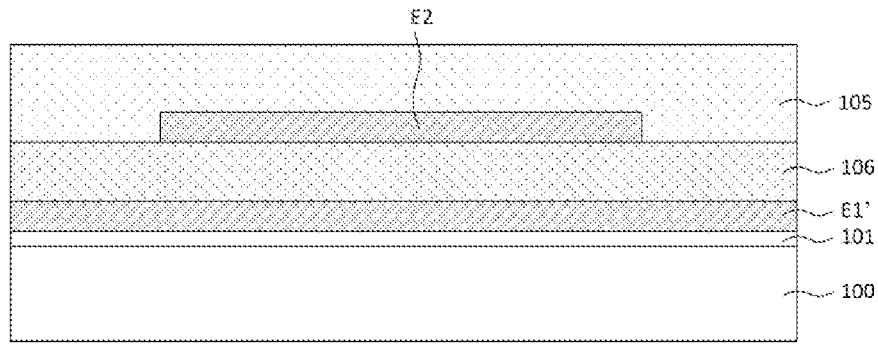

Referring to FIG. 5A to FIG. 5B, in some embodiments, a dielectric layer 101, an electrode material layer E1', a piezoelectric layer 106 and an electrode E2 are formed on the substrate 100 through the process steps illustrated in FIG. 2A to FIG. 2C. Thereafter, as shown in FIG. 5B, a dielectric layer 105 is formed on the side of the piezoelectric layer 106 and electrode E2 away from the substrate 100.

Figure 5C:
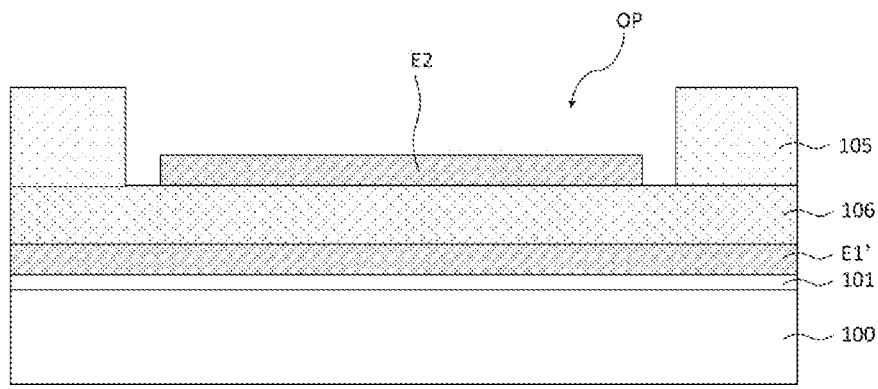

Referring to FIG. 5C, in some embodiments, a patterning process (e.g., including photolithography and etching processes) is performed on the dielectric layer 105 to remove a portion of the dielectric layer 105 and form an opening OP in the dielectric layer 105. In this embodiment, the patterning process forms the opening OP for defining a cavity. In some embodiments, the opening OP extends through the dielectric layer 105 and exposes the surface of electrode E2 (e.g., the surface of electrode E2 at the side away from the piezoelectric layer 106 and the sidewalls of the electrode E2) and a portion of the surface of the piezoelectric layer 106 at the side away from the electrode material layer E1'.

Figure 5D:
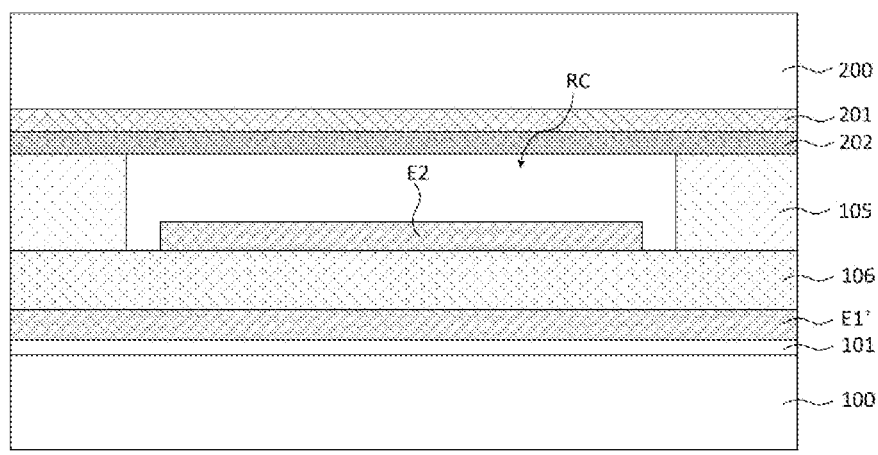

Referring to FIG. 5D, in some embodiments, through processes similar to those described in FIG. 2G to FIG. 2H, a carrier substrate 200 is provided, and a barrier layer 201 and a buffer layer 202 are formed on the carrier substrate 200, thereafter, the buffer layer 202 and the dielectric layer 105 are bonded together, and a cavity RC surrounded by the piezoelectric layer 106, the dielectric layer 105 and the buffer layer 202 is formed at the position where the opening OP of the dielectric layer 105 is located.

Figure 5E:
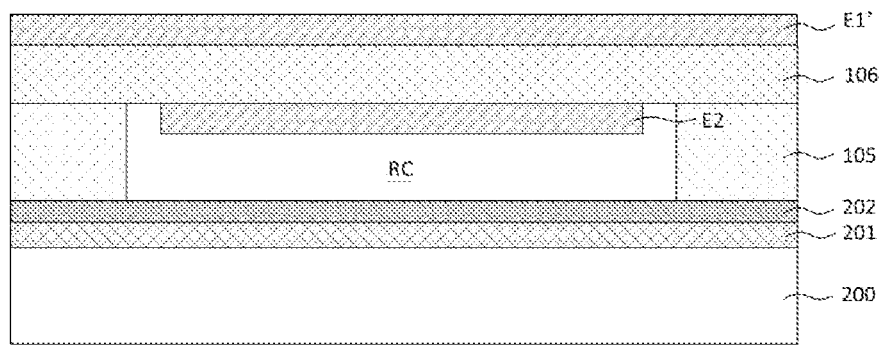
Figure 5F:
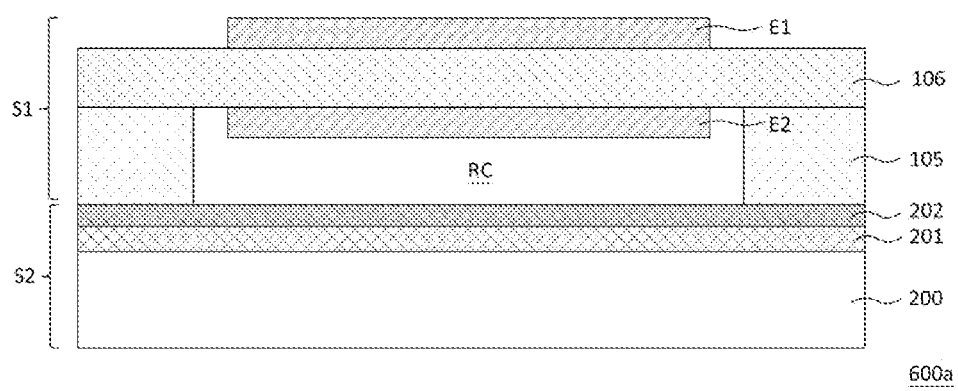

Referring to FIG. 5D to FIG. 5F, thereafter, the structure shown in FIG. 5D is turned over, and the substrate 100 and the dielectric layer 101 are removed to expose the surface of the electrode material layer E1' at the side away from the piezoelectric layer 106, and a patterning process is performed on the electrode material layer E1' to form an electrode E1, thereby forming a semiconductor device 600a.

Referring to FIG. 5F, the semiconductor device 600a includes a sub-semiconductor structure S1 and a sub-semiconductor structure S2; the sub-semiconductor structure S1 includes the piezoelectric layer 106, the electrodes E1 and E2 formed on opposite sides of the piezoelectric layer 106, and the dielectric layer 105 formed on the side of the piezoelectric layer 106 away from the electrode E1, the sub-semiconductor structure S2 includes the carrier substrate 200, the barrier layer 201 and the buffer layer 202; the sub-semiconductor structure S1 and the sub-semiconductor structure S2 encloses to form the cavity RC, and the cavity RC is formed between the piezoelectric layer 106, the dielectric layer 105 and the buffer layer 202. In some embodiments, the electrode E2 is disposed in the cavity RC and is spaced apart from the dielectric layer 105. In the semiconductor device 600a, the sub-semiconductor structures S1 and S2 are bonded together through the bonding of the dielectric layer 105 to a portion of the buffer layer 202, and the other portion of the buffer layer 202 faces the piezoelectric layer 106 and is used for defining the cavity RC.

FIG. 6A to FIG. 6F schematically illustrate the bonding manners between the respective sub-semiconductor structures of the semiconductor devices 600b-600g.

The forming methods of the semiconductor devices 600b to 600g are similar to that of the semiconductor device 600a, except that: in the semiconductor devices 600b to 600g, the material layers included in the sub-semiconductor structure S2 are different, and the sub-semiconductor structure S1 further includes a bonding layer BL1. In some embodiments, the formation of the bonding layer BL1 in the sub-semiconductor structure S1 may include the following process: referring also to FIG. 5C, after the opening OP is formed in the dielectric layer 105 by the process shown in FIG. 5C and before the bonding process, a bonding layer BL1 may be formed over the substrate 100, the bonding layer BL1 covers the surface of the dielectric layer 105 at the side away from the piezoelectric layer 106, and is filled into the opening OP of the dielectric layer 105 to line the surface of the opening OP, that is, the bonding layer BL1 further covers the surfaces of the dielectric layer 105, the electrode E2, and the piezoelectric layer 106 exposed in the opening OP. That is to say, the bonding layer BL1 covers the surface of the dielectric layer 105 at the side away from the piezoelectric layer 106, the sidewalls of the dielectric layer 105, the surface of the electrode E2 at the side away from the piezoelectric layer 106 and the sidewalls of the electrode E2 and a portion of the surface of the piezoelectric layer 106 at the side close to the electrode E2. In other words, the bonding layer BL1 has a portion covering the surface of the dielectric layer 105 at the side close to the sub-semiconductor structure S2 and extending in a direction parallel to the main surface of the carrier substrate 200, and the bonding layer BL1 has the other portion recessed into the opening OP of the dielectric layer 105 from the portion of the bonding layer BL1 toward the piezoelectric layer 106. Thereafter, the portion of the bonding layer BL1 of the sub-semiconductor structure S1 (i.e., a portion of the bonding layer BL1 outside the opening OP1 and located on the side of the dielectric layer 105 close to the sub-semiconductor structure S2) and a corresponding portion of a corresponding material layer of the sub-semiconductor structure S2 are bonded together, while the other portion of the bonding layer BL1 located in the opening OP and the corresponding other portion of the corresponding material layer of the sub-semiconductor structure S2 enclose and form a cavity RC therebetween.

Figure 6A:
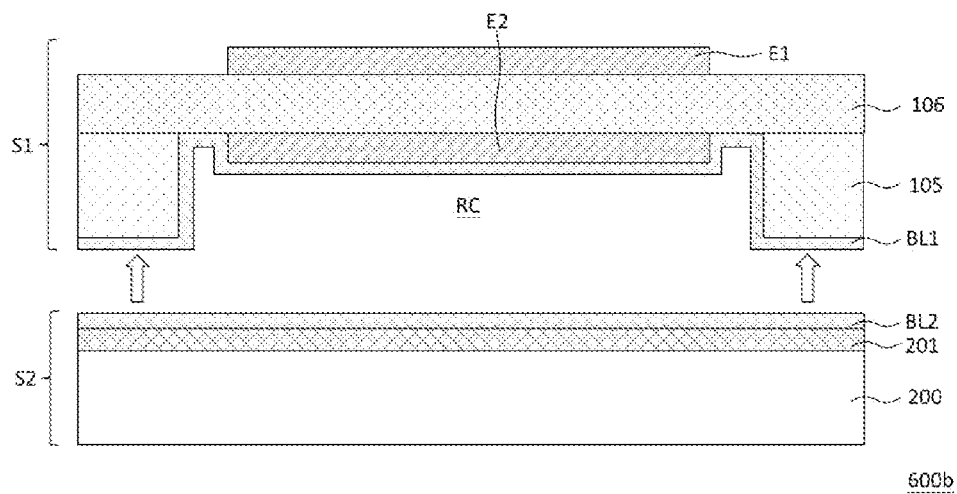
FIG. 6A to FIG. 6F briefly illustrate bonding manners between sub-semiconductor structures in respective semiconductor devices according to some other embodiments of the present disclosure.

Referring to FIG. 6A, in the semiconductor device 600b, the sub-semiconductor structure S1 includes the piezoelectric layer 106, the electrodes E1 and E2, the dielectric layer 105, and the bonding layer BL1, and the sub-semiconductor structure S2 includes the carrier substrate 200, the barrier layer 201 and the bonding layer BL2. The sub-semiconductor structure S1 and the sub-semiconductor structure S2 are bonded together through the bonding of the bonding layer BL1 and the bonding layer BL2 to each other, and the sub-semiconductor structure S1 and the sub-semiconductor structure S2 enclose to form the cavity RC. Specifically, some portions of the bonding layer BL1 and the bonding layer BL2 are bonded to and in direct contact with each other, while other portions of the bonding layer BL1 and the bonding layer BL2 are spaced apart from each other by the cavity RC (e.g., in a direction perpendicular to the carrier substrate 200), that is, the cavity RC is defined between the other portions of the bonding layer BL1 and the bonding layer BL2, and expose the surfaces of the other portions of the bonding layers BL1 and BL2.

Figure 6B:
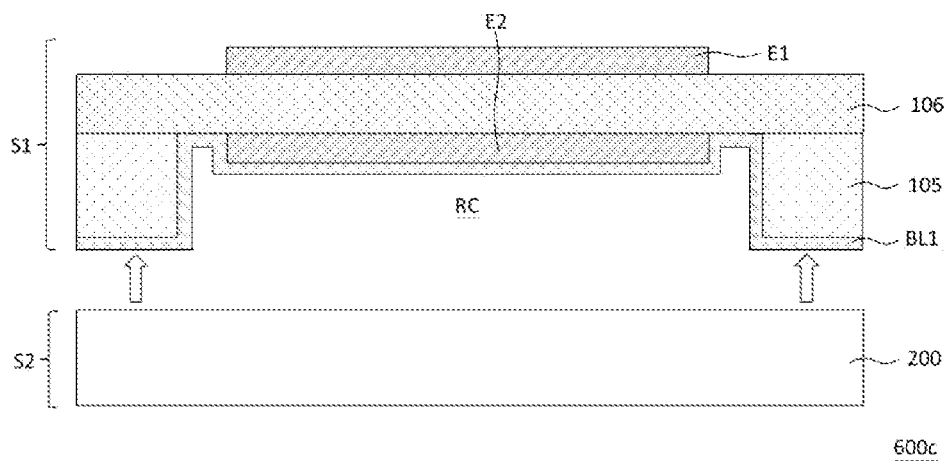

Referring to FIG. 6B, in the semiconductor device 600c, the sub-semiconductor structure S1 includes the piezoelectric layer 106, the electrodes E1 and E2, the dielectric layer 105, and the bonding layer BL1, and the sub-semiconductor structure S2 includes the carrier substrate 200. The sub-semiconductor structure S1 and the sub-semiconductor structure S2 are bonded together through the bonding of the bonding layer BL1 and the carrier substrate 200 to each other, and the bonding layer BL1 and the carrier substrate 200 enclose to form the cavity RC. Specifically, portions of the bonding layer BL1 and the carrier substrate 200 are bonded to and in direct contact with each other, while other portions of the bonding layer BL1 and the carrier substrate 200 are spaced apart from each other by the cavity RC (e.g., in a direction perpendicular to the main surface of the carrier substrate 200), that is, the cavity RC is defined between the other portions of the bonding layer BL1 and the carrier substrate 200, and exposes the surfaces of the other portions of the bonding layer BL1 and the carrier substrate 200.

Figure 6C:
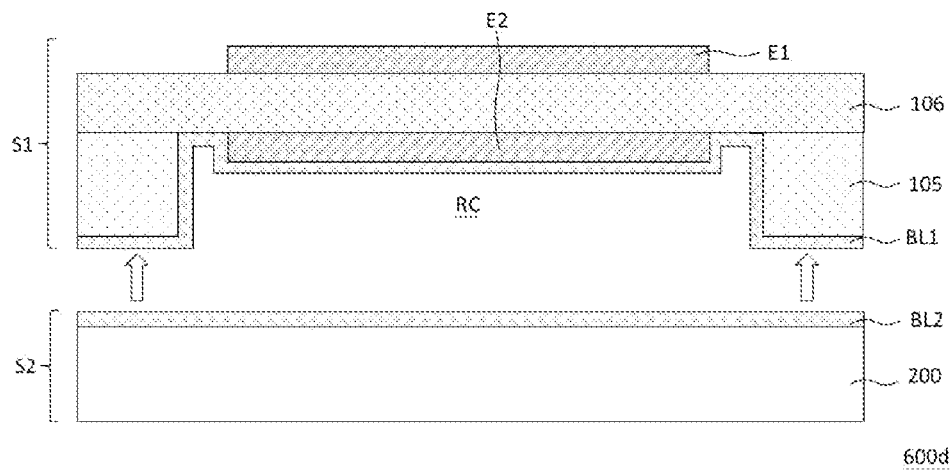

Referring to FIG. 6C, in the semiconductor device 600d, the sub-semiconductor structure S1 includes the piezoelectric layer 106, the electrodes E1 and E2, the dielectric layer 105, and the bonding layer BL1, and the sub-semiconductor structure S2 includes the carrier substrate 200 and the bonding layer BL2. The sub-semiconductor structure S1 and the sub-semiconductor structure S2 are bonded together through the bonding of the bonding layer BL1 and the bonding layer BL2 to each other, and the bonding layer BL1 and the bonding layer BL2 enclose to form the cavity RC. Specifically, some portions of the bonding layer BL1 and the bonding layer BL2 are bonded to and in direct contact with each other, while other portions of the bonding layer BL1 and the bonding layer BL2 are spaced apart from each other by the cavity RC (e.g., in a direction perpendicular to the main surface of the carrier substrate 200), that is, the cavity RC is defined between the other portions of the bonding layer BL1 and the bonding layer BL2, and exposes the surfaces of the other portions of the bonding layer BL1 and the bonding layer BL2.

Figure 6D:
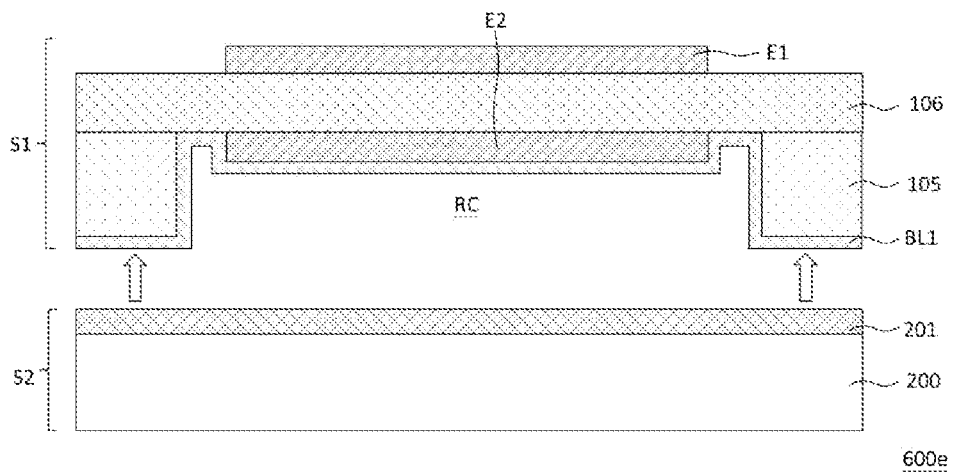

Referring to FIG. 6D, in the semiconductor device 600e, the sub-semiconductor structure S1 includes the piezoelectric layer 106, the electrodes E1 and E2, the dielectric layer 105, and the bonding layer BL1, and the sub-semiconductor structure S2 includes the carrier substrate 200 and the barrier layer 201. The sub-semiconductor structure S1 and the sub-semiconductor structure S2 are bonded together through the bonding of the bonding layer BL1 and the barrier layer 201 to each other, and the bonding layer BL1 and the barrier layer 201 enclose to form the cavity RC. Specifically, some portions of the bonding layer BL1 and the barrier layer 201 are bonded to and in direct contact with each other, while other portions of the bonding layer BL1 and the barrier layer 201 are spaced apart from each other by the cavity RC (e.g., in a direction perpendicular to the main surface of the carrier substrate 200), that is, the cavity RC is defined between the other portions of the bonding layer BL1 and the barrier layer 201, and exposes the surfaces of the other portions of the bonding layer BL1 and the barrier layer 201.

Figure 6E:
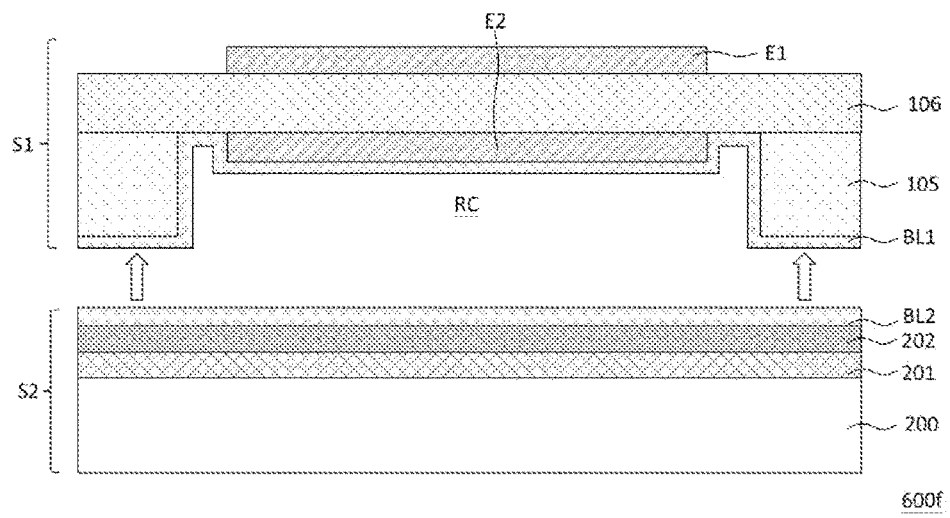

Referring to FIG. 6E, in the semiconductor device 600f, the sub-semiconductor structure S1 includes the piezoelectric layer 106, the electrodes E1 and E2, the dielectric layer 105, and the bonding layer BL1, and the sub-semiconductor structure S2 includes the carrier substrate 200, the barrier layer 201, the buffer layer 202 and the bonding layer BL2. The sub-semiconductor structure S1 and the sub-semiconductor structure S2 are bonded together through the bonding of the bonding layer BL1 and the bonding layer BL2 to each other, and the bonding layer BL1 and the bonding layer BL2 enclose to form the cavity RC. Specifically, some portions of the bonding layer BL1 and the bonding layer BL2 are bonded to and in direct contact with each other, while other portions of the bonding layer BL1 and the bonding layer BL2 are spaced apart from each other by the cavity RC (e.g., in a direction perpendicular to the main surface of the carrier substrate 200), that is, the cavity RC is defined between the other portions of the bonding layer BL1 and the bonding layer BL2 and exposes the surfaces of the other portions of the bonding layer BL1 and the bonding layer BL2.

Figure 6F:
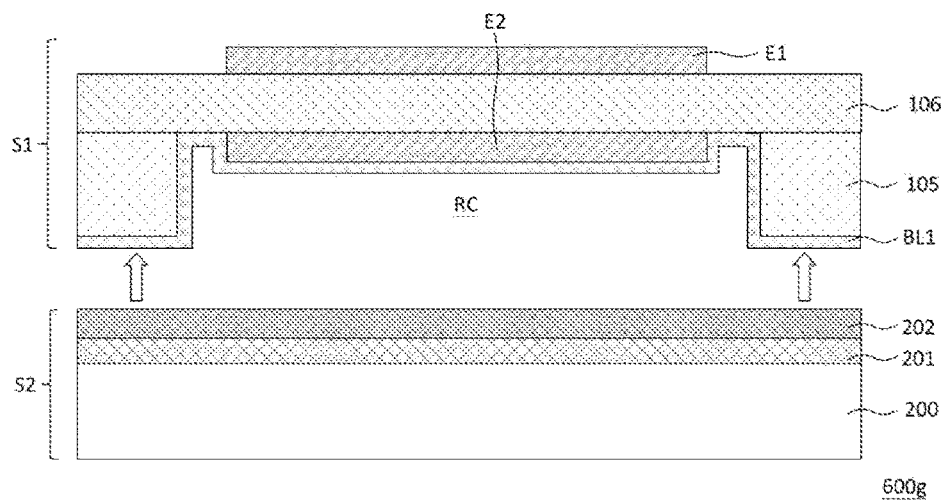

Referring to FIG. 6F, in the semiconductor device 600g, the sub-semiconductor structure S1 includes the piezoelectric layer 106, the electrodes E1 and E2, the dielectric layer 105, and the bonding layer BL1, and the sub-semiconductor structure S2 includes the carrier substrate 200, the barrier layer 201 and the buffer layer 202. The sub-semiconductor structure S1 and the sub-semiconductor structure S2 are bonded together through the bonding of the bonding layer BL1 and the buffer layer 202 to each other, and the bonding layer BL1 and the buffer layer 202 enclose to form the cavity RC. Specifically, some portions of the bonding layer BL1 and the buffer layer 202 are bonded to and in direct contact with each other, while other portions of the bonding layer BL1 and the buffer layer 202 are spaced apart from each other by the cavity RC (e.g., in a direction perpendicular to the main surface of the carrier substrate 200), that is, the cavity RC is defined between the other portions of the bonding layer BL1 and the buffer layer 202 and exposes the surfaces of the other portions of the bonding layer BL1 and the buffer layer 202.

In the above-described embodiments, the semiconductor devices 500a-500g and 600a-600g may be bulk acoustic wave resonators. The embodiments of the present disclosure also provide a filter, and the filter may include one or more of the above-described bulk acoustic wave resonators.

Figure 7:
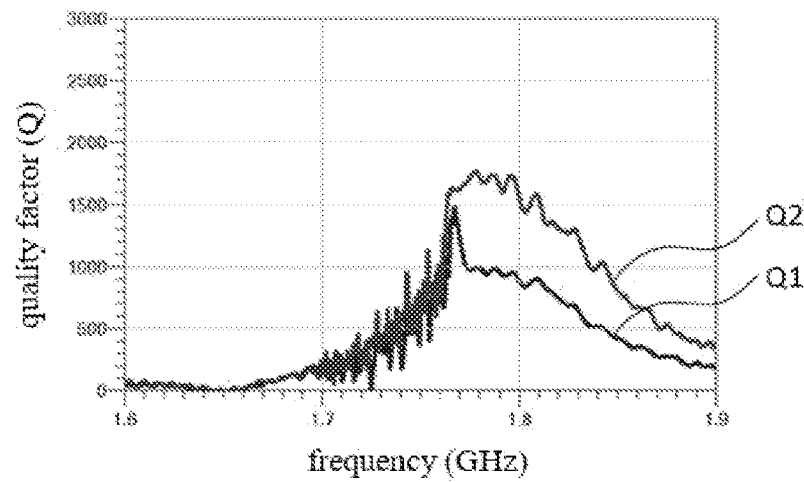
FIG. 7 is a graph comparing the quality factor changing with frequency of a bulk acoustic wave resonator provided with a charge accumulation preventing layer according to an embodiment of the present disclosure and the quality factor changing with frequency of a bulk acoustic wave resonator without a charge accumulation preventing layer.

FIG. 7 is a graph comparing the curve Q1 of the quality factor changing with frequency of a bulk acoustic wave resonator without a charge accumulation preventing layer (for example, with a carrier substrate 200 bonded to and in direct contact with a dielectric layer 105 including silicon oxide) and the curve Q2 of the quality factor changing with frequency of a bulk acoustic wave resonator provided with a charge accumulation preventing layer according to an embodiment of the present disclosure. As shown in FIG. 7, by comparing the curve Q1 and the curve Q2, it can be seen that, in the embodiments of the present disclosure, through disposing the charge accumulation preventing layer, undesired conductive channel is avoided form being generated due to charge accumulation on the surface of the carrier substrate 200, which can avoid or reduce the radio frequency loss of the resonator, thereby improving the performance of the resonator, and the quality factor (Q) of the resonator is greatly improved.

In various embodiments of the present disclosure, a charge accumulation preventing layer is disposed on the surface of the carrier substrate, and electron-rich material (e.g., native silicon oxide layer) that may be existed on the surface of the carrier substrate is removed before disposing the charge accumulation preventing layer, as such, undesired conductive channel can be prevented from being generated due to charge accumulation on the surface of the carrier substrate. For example, the carrier substrate may be a semiconductor substrate, the charge accumulation preventing layer includes a non-electron-rich material, and at least a surface layer of the charge accumulation preventing layer contacting the carrier substrate does not include an electron-rich material; therefore, a contact interface between a semiconductor material and an electron-rich material that may cause charge accumulation is avoided from being formed on the surface of the carrier substrate, thereby preventing the semiconductor material of the carrier substrate from capturing electrons from the electron-rich material to form charge accumulation and generate undesired conductive channel, which can further improves the performance of the semiconductor device. In the embodiments in which the semiconductor device is a bulk acoustic wave resonator, such a configuration can avoid or reduce radio frequency loss of the bulk acoustic wave resonator and the filter including the same, thereby improving the performance and quality factor of the resonator and filter.

It should be understood that, the concept of the embodiments of the present disclosure is described in the foregoing embodiments taken the semiconductor devices 500a-500g and 600a-600g as examples, but the present disclosure is not limited thereto. The embodiments of the present disclosure can also be applied to other types of semiconductor devices other than bulk acoustic wave resonator, so as to from a charge accumulation preventing layer on the surface of semiconductor substrate, thereby avoiding undesired conductive channel from being generated due to charge accumulation on the surface of the semiconductor substrate, which can improve the performance of the semiconductor device.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The above are only the specific embodiments of the present disclosure, but the scope of protection of the present disclosure is not limited thereto. Any of those skilled in the art can easily think of changes or substitutions within the technical scope disclosed in the present disclosure, which should be covered by the scope of protection of the present disclosure. Therefore, the scope of protection of the present disclosure shall be subject to the scope of protection of the claims.

The invention claimed is:

1. A semiconductor device, comprising:
a first sub-semiconductor structure, comprising a dielectric layer; and
a second sub-semiconductor structure, at least comprising a carrier substrate, and being bonded to the first sub-semiconductor structure,
wherein the first sub-semiconductor structure or the second sub-semiconductor structure comprises a charge accumulation preventing layer, and the charge accumulation preventing layer is disposed between the carrier substrate and the dielectric layer, and is configured to avoid an undesired conductive channel from being generated due to charge accumulation on a surface of the carrier substrate;
wherein the second sub-semiconductor structure comprises a barrier layer, the barrier layer is disposed on the carrier substrate and between the carrier substrate and the dielectric layer, and the barrier layer is in direct contact with the carrier substrate and serves as the charge accumulation preventing layer; and
wherein the barrier layer is a multi-layer structure, and the barrier layer comprises a stack layer comprising at least two selected from a group consisting of polysilicon, amorphous silicon, silicon nitride, silicon carbide, aluminum nitride, gallium nitride and silicon oxide, and wherein a surface layer of the barrier layer contacting the carrier substrate does not include silicon oxide.

2. The semiconductor device of claim 1, wherein the carrier substrate is a semiconductor substrate, and at least the surface layer of the barrier layer contacting the carrier substrate is a non-conductive and layer.

3. The semiconductor device of claim 1, wherein the surface layer of the barrier layer comprises at least one selected from a group consisting of polysilicon, amorphous silicon, silicon nitride, silicon carbide, aluminum nitride and gallium nitride.

4. The semiconductor device of claim 1, wherein a contact interface between the carrier substrate and the charge accumulation preventing layer does not include a contact interface between monocrystalline silicon and silicon oxide.

5. The semiconductor device of claim 1, wherein the second sub-semiconductor structure further comprises a buffer layer, and the buffer layer is disposed on a side of the barrier layer away from the carrier substrate and between the barrier layer and the dielectric layer.

6. The semiconductor device of claim 5, wherein,
the first sub-semiconductor structure further comprises a first bonding layer, and the first bonding layer is disposed on a side of the dielectric layer close to the second sub-semiconductor structure,
the second sub-semiconductor structure further comprises a second bonding layer, and the second bonding layer is disposed on a side of the buffer layer close to the first sub-semiconductor structure,
the first sub-semiconductor structure and the second sub-semiconductor structure are bonded together through bonding the first bonding layer and the second bonding layer to each other.

7. The semiconductor device of claim 6, wherein the first bonding layer and the second bonding layer comprise amorphous silicon.

8. The semiconductor device of claim 5, wherein,
the first sub-semiconductor structure further comprises a first bonding layer, and the first bonding layer is disposed on a side of the dielectric layer close to the second sub-semiconductor structure,
the first sub-semiconductor structure and the second sub-semiconductor structure are bonded together through bonding the first bonding layer and the buffer layer to each other,
wherein the first bonding layer comprises amorphous silicon, and the buffer layer comprises at least one selected from a group consisting of silicon nitride, silicon oxide, aluminum nitride, polysilicon, and amorphous silicon, and at least a surface layer of the buffer layer at a side away from the carrier substrate comprises polysilicon or amorphous silicon.

9. The semiconductor device of claim 5, wherein a material of the buffer layer comprises at least one selected from a group consisting of silicon nitride, silicon oxide, aluminum nitride, polysilicon, and amorphous silicon,
wherein one of a material of the buffer layer and a material of the barrier layer has tensile stress, and the other one of the material of the buffer layer and the material of the barrier layer has compressive stress, so as to be configured to balance a warpage of the carrier substrate.

10. The semiconductor device of claim 5, wherein the first sub-semiconductor structure and the second sub-semiconductor structure are bonded together through bonding the dielectric layer and the buffer layer to each other.

11. The semiconductor device of claim 1, wherein the first sub-semiconductor structure further comprises a first bonding layer, and the first bonding layer is disposed on a side of the dielectric layer close to the second sub-semiconductor structure, and the first sub-semiconductor structure and the second sub-semiconductor structure are bonded together through bonding the first bonding layer and the barrier layer to each other,
wherein the first bonding layer comprises amorphous silicon, and at least a surface layer of the barrier layer at a side away from the carrier substrate comprises polysilicon or amorphous silicon.

12. The semiconductor device of claim 1, wherein,
the first sub-semiconductor structure further comprises a first bonding layer, and the first bonding layer is disposed on a side of the dielectric layer close to the second sub-semiconductor structure,
the second sub-semiconductor structure further comprises a second bonding layer, and the second bonding layer is disposed on a side of the barrier layer close to the first sub-semiconductor structure, and
the first sub-semiconductor structure and the second sub-semiconductor structure are bonded together through bonding the first bonding layer and the second bonding layer to each other.

13. The semiconductor device according to claim 1, wherein the first sub-semiconductor structure has a cavity, and a portion of a boundary of the cavity is defined by the dielectric layer,
wherein the first sub-semiconductor structure and the second sub-semiconductor structure enclose to form the cavity, and the cavity is defined by material layers of the first sub-semiconductor structure and the second sub-semiconductor structure that faces each other.

14. The semiconductor device of claim 1, wherein,
the semiconductor device is a bulk acoustic wave resonator, and the first sub-semiconductor structure further comprises a piezoelectric layer, and a first electrode and a second electrode disposed on opposite sides of the piezoelectric layer, the dielectric layer is disposed between the piezoelectric layer and the second sub-semiconductor structure,
the bulk acoustic wave resonator has a cavity, and the cavity is disposed between the piezoelectric layer and the second sub-semiconductor structure, and is surrounded by the dielectric layer in a direction parallel to a main surface of the carrier substrate.

15. The semiconductor device of claim 14, wherein,
the cavity is defined by the dielectric layer and the piezoelectric layer;
the dielectric layer has sidewalls facing each other and defining the cavity in the direction parallel to the main surface of the carrier substrate;
the dielectric layer and the piezoelectric layer have surfaces facing each other and defining the cavity in a direction perpendicular to the main surface of the carrier substrate.

16. The semiconductor device of claim 14, wherein,
the second sub-semiconductor structure further comprises a buffer layer, and the buffer layer is disposed on a side of the barrier layer close to the first sub-semiconductor structure;
the cavity is defined by the dielectric layer, the piezoelectric layer of the first sub-semiconductor structure and the buffer layer of the second sub-semiconductor structure.

17. A semiconductor device, comprising:
a first sub-semiconductor structure, comprising a dielectric layer; and
a second sub-semiconductor structure, at least comprising a carrier substrate, and being bonded to the first sub-semiconductor structure,
wherein the first sub-semiconductor structure or the second sub-semiconductor structure comprises a charge accumulation preventing layer, and the charge accumulation preventing layer is disposed between the carrier substrate and the dielectric layer, and is configured to avoid an undesired conductive channel from being generated due to charge accumulation on a surface of the carrier substrate;
wherein the semiconductor device is a bulk acoustic wave resonator, and the first sub-semiconductor structure further comprises a piezoelectric layer, and a first electrode and a second electrode disposed on opposite sides of the piezoelectric layer, the dielectric layer is disposed between the piezoelectric layer and the second sub-semiconductor structure,
the bulk acoustic wave resonator has a cavity, and the cavity is disposed between the piezoelectric layer and the second sub-semiconductor structure, and is surrounded by the dielectric layer in a direction parallel to a main surface of the carrier substrate;
wherein the first sub-semiconductor structure further comprises a first bonding layer, and the first bonding layer is disposed along sidewalls of the dielectric layer and a surface of the dielectric layer at a side close to the second sub-semiconductor structure, and surfaces of the piezoelectric layer and the second electrode at a side close to the second sub-semiconductor structure; a first portion of the first bonding layer is bonded to the second sub-semiconductor structure, and the cavity is defined between a second portion of the first bonding layer and the second sub-semiconductor structure.

18. The semiconductor device of claim 17, wherein,
the second sub-semiconductor structure further comprises
a second bonding layer, and the second bonding layer
is disposed on a side of the carrier substrate close to the
first sub-semiconductor structure, the first portion of
the first bonding layer is bonded to a first portion of the
second bonding layer, and the cavity is defined between
the second portion of the first bonding layer and a
second portion of the second bonding layer, or the first portion of the first bonding layer is bonded to a
first portion of the carrier substrate, and the cavity is
defined between the second portion of the first bonding
layer and a second portion of the carrier substrate, or the second sub-semiconductor structure further comprises
a barrier layer, and the barrier layer is disposed on a
side of the carrier substrate close to the first sub-
semiconductor structure, the first portion of the first
bonding layer is bonded to a first portion of the barrier
layer, and the cavity is defined between the second
portion of the first bonding layer and a second portion
of the barrier layer, or the second sub-semiconductor structure further comprises
a barrier layer and a buffer layer, the barrier layer and
the buffer layer are disposed on a side of the carrier
substrate close to the first sub-semiconductor structure,
the first portion of the first bonding layer is bonded to
a first portion of the buffer layer, and the cavity is
defined between the second portion of the first bonding
layer and a second portion of the buffer layer.

\* \* \* \* \*